(12) United States Patent
Zhang et al.

(10) Patent No.: US 12,336,149 B2
(45) Date of Patent: Jun. 17, 2025

(54) HEAT SINK AND COMMUNICATION DEVICE

(71) Applicant: HUAWEI TECHNOLOGIES CO., LTD., Guangdong (CN)

(72) Inventors: Yu Zhang, Minsk (BY); Lei Li, Shanghai (CN); Dong Wang, Shanghai (CN); Meng Wang, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 139 days.

(21) Appl. No.: 18/348,396

(22) Filed: Jul. 7, 2023

(65) Prior Publication Data
US 2023/0354557 A1 Nov. 2, 2023

Related U.S. Application Data

(63) Continuation of application No. PCT/CN2022/070742, filed on Jan. 7, 2022.

(30) Foreign Application Priority Data

Jan. 8, 2021 (CN) .......................... 202110024923.0

(51) Int. Cl.
H05K 7/20 (2006.01)

(52) U.S. Cl.
CPC ..... *H05K 7/20409* (2013.01); *H05K 7/20218* (2013.01)

(58) Field of Classification Search
CPC .... F28F 2215/06; H01L 23/427; F28D 15/04; H05K 7/20218; H05K 7/2029; H05K 7/20409; H05K 7/20336
See application file for complete search history.

(56) References Cited

U.S. PATENT DOCUMENTS 10,483,190 B2 * 11/2019 Lin ..................... H01L 21/4882
10,900,718 B2 * 1/2021 Narasimhan ............ F28D 15/04
(Continued)

FOREIGN PATENT DOCUMENTS

CN 102338584 A 2/2012
CN 103363499 A 10/2013
(Continued)

OTHER PUBLICATIONS

CN-112188792-A Translation (Year: 2021).*
Extended European Search Report for European Application No. 22736596.2 dated May 28, 2024 (9 pages).

*Primary Examiner* — Jayprakash N Gandhi
*Assistant Examiner* — Matthew Sinclair Muir

(57) ABSTRACT

A heat sink includes a substrate, a heat dissipation structure, and a refrigerating medium. The heat dissipation structure includes a connection part and a fin part that are of an integrated structure, the connection part is connected to the substrate, the fin part and the connection part are disposed at an included angle, a fin root of the fin part is connected to the connection part, and a fin top of the fin part is far away from the connection part, a cooling flow channel is disposed in the heat dissipation structure, and at least a part of the cooling flow channel is located in the fin part. The refrigerating medium flows in the cooling flow channel to dissipate heat from the substrate. A heat conduction capability of the heat sink can therefore be improved, and heat dissipation reliability is ensured.

20 Claims, 27 Drawing Sheets

(56) References Cited

U.S. PATENT DOCUMENTS

| | | | |
|---|---|---|---|
| 11,435,144 B2* | 9/2022 | Liu | F28D 15/0275 |
| 2005/0173098 A1* | 8/2005 | Connors | F28D 15/0233 |
| | | | 165/104.21 |
| 2008/0062651 A1 | 3/2008 | Reis et al. | |
| 2009/0040726 A1* | 2/2009 | Hoffman | F28D 15/0233 |
| | | | 29/890.032 |
| 2010/0108297 A1* | 5/2010 | Chen | H01L 23/427 |
| | | | 29/890.032 |
| 2016/0348985 A1* | 12/2016 | Sun | F28D 15/04 |
| 2019/0335619 A1 | 10/2019 | Tseng et al. | |
| 2020/0018555 A1 | 1/2020 | Lin | |

FOREIGN PATENT DOCUMENTS

| | | | | |
|---|---|---|---|---|
| CN | 110446398 A | | 11/2019 | |
| CN | 110505791 A | | 11/2019 | |
| CN | 111256505 A | | 6/2020 | |
| CN | 112188792 A | * | 1/2021 | H05K 7/2029 |
| EP | 4195894 A1 | | 6/2023 | |
| JP | 2002151636 A | | 5/2002 | |
| JP | 2005229102 A | | 8/2005 | |
| WO | 2020225981 A1 | | 11/2020 | |

\* cited by examiner

HEAT SINK AND COMMUNICATION DEVICE

CROSS-REFERENCE TO RELATED APPLICATIONS

This application is a continuation of International Application No. PCT/CN2022/070742, filed on Jan. 7, 2022, which claims priority to Chinese Patent Application No. 202110024923.0, filed on Jan. 8, 2021. The disclosures of the aforementioned applications are hereby incorporated by reference in their entireties.

TECHNICAL FIELD

This disclosure relates to the field of heat dissipation technologies, and in particular, to a heat sink and a communication device.

BACKGROUND

With development of communication technologies, speeds and power density of communication devices are increasing high, and heat consumption density of the communication devices is also increasing high. Heat dissipation becomes an important challenge in design of the communication device, and whether the communication device can perform good heat dissipation directly affects working reliability and comprehensive performance of the communication device. The communication device includes a heat sink, and the heat sink needs to have corresponding heat dissipation design. However, a conventional heat sink has a low heat conduction capability and low heat dissipation reliability.

SUMMARY

Embodiments of this disclosure provide a heat sink and a communication device, so that a heat conduction capability of the heat sink can be improved, and heat dissipation reliability is good.

According to a first aspect, this disclosure provides a heat sink. The heat sink includes:
a substrate;
a heat dissipation structure, where the heat dissipation structure includes a connection part and a fin part that are of an integrated structure, the connection part is connected to the substrate, the fin part and the connection part are disposed at an included angle, a fin root of the fin part is connected to the connection part, a fin top of the fin part is away from the connection part, a cooling flow channel is disposed in the heat dissipation structure, and at least a part of the cooling flow channel is located in the fin part; and
a refrigerating medium, where the refrigerating medium flows in the cooling flow channel to dissipate heat from the substrate.

In a possible implementation, the cooling flow channel extends from the connection part to the fin part and extends between the fin root and the fin top.

In another possible implementation, the cooling flow channel is located only in the fin part and extends between the fin root and the fin top.

It may be understood that the heat dissipation structure may be a primary heat dissipation component in the heat sink formed by bending a rib with the cooling flow channel at least once based on an actual heat dissipation requirement of the heat sink after the rib with the cooling flow channel is processed at one time. The bending may also be understood as folding, that is, the rib with the cooling flow channel is folded at least once. Folding cases may include a case in which one part and the other part are adjacent to each other, or may include a case in which one part and the other part are spaced apart. It should be understood that the cooling flow channel may be folded with folding of the rib, for example, presented in a bent form following a bent form of the rib.

Therefore, it should be understood that the heat dissipation structure can be processed, folded, and formed once to form the integrated structure, so that the heat dissipation structure serves as a heat dissipation fin, namely, the primary heat dissipation component, of the heat sink, and is well presented as a form required for heat dissipation of a heat generation element. In one aspect, the heat dissipation structure can be used as a whole to be connected to the substrate, which effectively avoids a complex assembly process in which a plurality of heat dissipation fins need to be processed independently and sequentially assembled with the substrate in the conventional technology, helps save production time and costs, and improves processing and production efficiency of the heat sink. In another aspect, the connection part in the heat dissipation structure can be connected to the substrate. This saves a connection piece for fastening the heat dissipation fin that needs to be disposed between the substrate and the heat dissipation fin in the conventional technology, greatly reduces a space occupied by the heat dissipation structure, and reduces wind resistance of the heat sink. It is beneficial to a development trend of miniaturization of the heat sink, so that the heat sink is easy to transport and install.

Specifically, because the connection part is connected to the substrate, the connection part can be in contact with the substrate with a large contact area, that is, a whole connection area between the connection part and the substrate can be effectively increased, and a connection form of the connection part and the substrate is simple and flat. This can effectively reduce connection difficulty. In addition, a quantity of connection parts that need to be connected to the substrate can be reduced while the connection area to the substrate is increased, thereby reducing a pressure of connection costs and a risk of leakage of the refrigerating medium caused by a large quantity of connection parts, and significantly improving connection quality.

The fin part and the connection part are disposed at an included angle, that is, the fin part and the connection part are bent and connected. Therefore, the fin part may be regarded as a bent part in the heat dissipation structure, that is, a part protruding from the connection part and a part protruding from the substrate. The fin part is disposed, so that an external form requirement of the heat sink can be met in one aspect, and a heat dissipation area can be effectively increased without occupying a larger board surface area in another aspect. Compared with a structure in which heat dissipation fins are not connected intermittently in the solutions of the conventional technology, a continuous integrated structure of the fin part and the connection part is simple and reliable, and can further enlarge a condensation area of the refrigerating medium and promote flow-back of the refrigerating medium. Further, on the basis of satisfying a gravity direction gradient required for circulation of gas-liquid phase change, a fin height of the fin part can be effectively reduced, and a volume of the heat sink can be reduced. This can avoid problems of a heavy weight, high wind resistance, and uneasy transportation and installation caused by the increase of the volume of the heat sink, and improve a heat dissipation capability per unit volume of the heat sink.

In addition, the cooling flow channel is disposed inside the heat dissipation structure, so that the heat dissipation structure can innovatively have a heat dissipation characteristic of a two-phase temperature equalizing plate. In one aspect, heat of a high-power heat source conducted by the substrate can be effectively expanded, and heat conduction thermal resistance of the heat dissipation structure and a temperature of the substrate can be reduced, so that the heat dissipation structure has a good heat conduction temperature difference and heat transfer efficiency, thereby greatly improving heat conduction performance of the heat dissipation structure. In another aspect, a heat conduction capability of the heat dissipation structure can be improved, so that the volume, the weight, and thermal resistance of the heat sink can be correspondingly reduced when heat consumption is dissipated under same conditions, that is, same heat dissipation targets are achieved, thereby saving material management costs of the heat dissipation structure and having good heat dissipation reliability.

The cooling flow channel being located in the fin part and extending between the fin root and the fin top can be understood that the cooling flow channel is distributed only in the fin part that is not in direct contact with the substrate. In this setting, the heat dissipation structure can be presented as a structure with a flow channel in part and a solid in part. It is beneficial to multi-scenario application of the heat sink, and the heat sink has strong flexibility. Alternatively, that the cooling flow channel extends from the connection part to the fin part, and extends between the fin root and the fin top may be understood as that the extension path of the cooling flow channel is the same as a bending path of the heat dissipation structure, that is, the cooling flow channel extends along an extension direction of the heat dissipation structure, so that the cooling flow channel can be used as a whole throughout the heat dissipation structure. In addition, only one liquid filling port is required to fill the refrigerating medium for the cooling flow channel, which avoids a complex structure in which a flow channel needs to be arranged for each of a plurality of heat dissipation fins and a liquid filling port needs to fill the refrigerating medium for the flow channel in the conventional technology. Therefore, the cooling flow channel has an excellent characteristic of independent liquid filling, which is beneficial to improving heat dissipation benefits and processing and manufacturing efficiency of the heat sink.

In a possible implementation, the substrate and the heat dissipation structure are of an integrated structure.

For example, the heat dissipation structure and the substrate may be connected to each other by welding, gluing, crimping, or screw fastening to be the integrated structure. That is, the heat dissipation structure and the substrate are connected to be the integrated structure.

Therefore, in one aspect, production time and costs can be saved, and processing and production efficiency of the heat sink can be improved. In another aspect, after overall heat dissipation performance of the heat sink is improved, while an existing heat consumption level is maintained, the fin height of the fin part in the heat sink can be reduced due to improvement of heat dissipation performance. This reduces the volume and the weight of the entire heat sink in a disguised form. In other words, when heat dissipation requirements are the same, a structure of the heat sink provided in this embodiment of this disclosure is smaller than a structure of that in the conventional technology.

In a possible implementation, there are a plurality of connection parts, there are also a plurality of fin parts, fin roots of two adjacent fin parts are connected by using one connection part, and a spacing region between two adjacent fin parts forms a first air duct.

It may be understood that the spacing region between the two adjacent fin parts forms the first air duct. That is, cold air entering the heat sink can continuously flow to an external environment of the heat sink through the first air duct in a flow process. In one aspect, heated air in the first air duct can continuously flow to the external environment of the heat sink, and the cold air in the external environment can continuously enter the first air duct. This can quickly transfer heat on the heat dissipation structure to the external environment, improve a convection heat exchange level of natural heat dissipation, and increase the condensation area without occupying the large board surface area of the substrate, thereby having excellent heat dissipation performance. In another aspect, the double-layer heat dissipation structure of air-cooled heat dissipation and liquid-cooled heat dissipation can be formed by cooperating with the cooling flow channel inside the heat dissipation structure. This has diversified performance and wide application range, and can further improve the heat conduction capability of the heat sink.

It should be noted that, when the external environment of the fin part is air, a spacing region between two adjacent fin parts can form an air duct for air circulation. When the external environment of the fin part is liquid, a spacing region between two adjacent fin parts can form a liquid channel for liquid circulation. For example, the liquid may be water or oil. An external environment of the fin part is not strictly limited in this embodiment of this disclosure.

In a possible implementation, the substrate includes four side walls that are sequentially connected, and a ventilation direction of the first air duct intersects or is parallel to an extension direction of any side wall.

Therefore, heat at a bottom of the first air duct is inclined to rise along with a direction of the first air duct, so that hot air can flow from bottom to top along a specific angle based on a floating force, and cold air can flow from bottom to top along a specific angle based on a floating force. This quickly removes heat of the heat dissipation structure. The floating force does not easily affect temperatures of a lower region of the air duct and an upper region of the air duct, can reduce influence of a top-and-bottom heat serial connection caused by the heat dissipation structure, improve convection heat exchange performance of the heat dissipation structure, and effectively improve condensation heat exchange of the refrigerating medium inside the heat dissipation structure.

In a possible implementation, the fin part includes a first connection section, a second connection section, and a third connection section;

the first connection section and the third connection section are spaced from each other and are respectively connected to two adjacent connection parts, both the first connection section and the second connection section are disposed at an included angle with the two adjacent connection parts, and the second connection section is connected between an end that is of the first connection section and away from the connection part and an end that is of the third connection section and away from the connection part;

a joint of the first connection section, the second connection section, and the third connection section forms the fin top of the fin part, and a joint of the first connection section, the third connection section, and the two adjacent connection parts forms the fin root of the fin part; and a spacing region between the first connection section and the third connection section forms a second win duct.

Therefore, a cross-sectional shape of the fin part along a height direction of the fin part may be a "⊓" shape, and the height direction of the fin part may be understood as the fin height of the fin part, namely, a direction from the fin root to the fin top, or a direction from the fin top to the fin root, or a direction perpendicular to the substrate.

In this setting, the spacing region between the first connection section and the third connection section forms the second air duct. That is, the cold air entering the heat sink can continuously flow to the external environment of the heat sink through the second air duct in a flow process. In one aspect, heated air in the second air duct can continuously flow to the external environment of the heat sink, and the cold air in the external environment can continuously enter the second air duct. This can quickly transfer the heat on the heat dissipation structure to the external environment, improve the convection heat exchange level of natural heat dissipation, and increase the condensation area without occupying the large board surface area of the substrate, thereby having excellent heat dissipation performance. In another aspect, the double-layer heat dissipation structure of air-cooled heat dissipation and liquid-cooled heat dissipation can be formed by cooperating with the cooling flow channel inside the heat dissipation structure and the first air duct. This has diversified performance and wide application range, and can further improve the heat conduction capability of the heat sink.

In a possible implementation, the cooling flow channel includes a first evaporation region and a condensation region, the condensation region is located at the connection part and the fin root of the fin part, the first evaporation region is located at the fin top of the fin part, and the refrigerating medium is vaporized in the first evaporation region and liquefied in the condensation region to flow back to the first evaporation region.

It may be understood that, the refrigerating medium is a fluid working medium that can have dual functions of generating gas-liquid phase change and heat conduction, and can implement complete working substance circulation through action of the gas-liquid phase change. However, in this embodiment, the refrigerating medium flows only in the cooling flow channel, and therefore the cooling flow channel needs to have a region where complete gas-liquid conversion of the refrigerating medium can occur. That is, the cooling flow channel has the first evaporation region and the condensation region, and there is a specific height gradient between the first evaporation region and the condensation region, so that the refrigerating medium can be vaporized when flowing to the first evaporation region, and liquefied when flowing to the condensation region to flow back to the first evaporation region. This implements the gas-liquid phase change of the refrigerating medium. For example, the condensation region is located at the connection part and the fin root of the fin part, and the first evaporation region is located at the fin top of the fin part.

Therefore, heat generated by a heat generation element can be conducted to the first evaporation region in the heat dissipation structure through the substrate, the refrigerating medium in the first evaporation region is heated and vaporized in a low vacuum environment, and the gaseous refrigerating medium flows to the condensation region along the extension direction of the fin part (namely, the direction from the fin root to the fin top) under action of a pressure difference. The gaseous refrigerating medium flowing to the condensation region can be condensed into the liquid refrigerating medium, the liquid refrigerating medium is flowed back to the first evaporation region along a direction (namely, a direction from the fin top to the fin root) opposite to the foregoing direction under action of gravity, to form complete working substance circulation. This process is repeated in the cooling flow channel to implement continuous heat dissipation for the heat generation element.

In a possible implementation, the substrate is of a solid closed structure. That is, the substrate is a solid plate, and the refrigerating medium flows only in the cooling flow channel in the heat dissipation structure. Therefore, strength of the entire substrate is better. In addition, the substrate has a simple structure, and can be applied to a scenario without a high heat dissipation performance requirement. This can improve processing and production efficiency of the entire heat sink.

In a possible implementation, a cavity is disposed in the substrate, and the cavity is communicated with the cooling flow channel, so that the refrigerating medium flows in the cavity and the cooling flow channel.

Therefore, the entire substrate can be provided with a hollow structure. The cavity is communicated with the cooling flow channel, so that the refrigerating medium can flow in the cavity and the cooling flow channel. In other words, in this embodiment, the refrigerating medium flows in the cavity and the cooling flow channel. This can minimize a heat conduction temperature difference of the entire heat sink, and improve heat transfer efficiency of the entire heat sink.

In a possible implementation, the cavity is a second evaporation region, and the refrigerating medium is vaporized in the second evaporation region.

Specifically, the cavity is the second evaporation region, that is, the entire cavity constitutes the second evaporation region in the substrate, so that the refrigerating medium is vaporized in the second evaporation region. The cooling flow channel has the first evaporation region and the condensation region, and there is a specific height gradient between the first evaporation region and the condensation region, so that the refrigerating medium can be vaporized when flowing to the first evaporation region, and liquefied when flowing to the condensation region to flow back to the first evaporation region and the second evaporation region. This implements the gas-liquid phase change of the refrigerating medium. For example, the condensation region is located at the connection part and the fin root of the fin part, and the first evaporation region is located at the fin top of the fin part.

In a possible implementation, the connection part includes a contact surface, the substrate includes a first surface, and the contact surface is disposed opposite to the first surface; the cooling flow channel has a first through-flow structure, the first through-flow structure is disposed on the contact surface, the cavity has a second through-flow structure, and the second through-flow structure is disposed on the second surface; and the second through-flow structure is communicated with at least a part of the first through-flow structure.

For example, the second through-flow structure is communicated with a part of the first through-flow structure. Therefore, the refrigerating medium in the cavity can flow smoothly into the cooling flow channel with fluidity. In addition, an outlet of the cooling flow channel does not need to be totally communicated with an outlet of the cavity, so that a processing and manufacturing process of the heat sink can be simpler.

Alternatively, the second through-flow structure is communicated with all of the first through-flow structure.

Based on the foregoing description, it should be understood that a flow volume and a flow speed of the refrigerating medium can be controlled by changing a degree of communication between the second through-flow structure and the first through-flow structure, to ensure flow reliability and uniformity of the refrigerating medium in the substrate and the heat dissipation structure.

In a possible implementation, the first through-flow structure includes one or more first through-flow substructures spaced from each other, the second through-flow structure includes second through-flow substructures whose quantity is the same as that of the first through-flow substructures, and the first through-flow substructures and the second through-flow substructures are connected in a one-to-one manner.

Therefore, the first through-flow substructure and the second through-flow substructure can form a one-to-many matching relationship.

In a possible implementation, the first through-flow structure includes a plurality of first through-flow substructures spaced from each other, the second through-flow structure includes one second through-flow substructure, and each first through-flow substructure is connected to the second through-flow substructure.

In other words, the first through-flow substructure and the second through-flow substructure can form a one-to-many matching relationship. Therefore, the plurality of first through-flow substructures are intermittently designed, so that a problem that there is a risk of damage in an actual use process if a size of the outlet of the cooling flow channel is excessively large can be fully considered, and safety and reliability are good.

Alternatively, the first through-flow structure includes one first through-flow substructure, the second through-flow structure includes a plurality of second through-flow substructures spaced from each other, and each second through-flow substructure is connected to the first through-flow substructure.

In other words, the first through-flow substructure and the second through-flow substructure can form a one-to-many matching relationship. Therefore, the plurality of second through-flow substructures are intermittently designed, so that a specific layout limitation of a component and a structure member in the substrate can be fully considered. For example, a spacing region between adjacent second through-flow substructures can effectively avoid a structure support column, or a solid column for mounting a screw, disposed in the cavity, a layout is reasonable, and practicability is strong.

In a possible implementation, the heat sink further includes a support structure, the cavity includes a top wall and a bottom wall that are oppositely disposed along a height direction of the substrate, and the top wall is closer to the heat dissipation structure than the bottom wall; and
 the support structure is supported between the top wall and the bottom wall: or
 one end of two ends of the support structure is pressed against one of the top wall and the bottom wall, and the other end is isolated from the other of the top wall and the bottom wall.

That is, the support structure can be fastened to the top wall or the bottom wall, or both the top wall and the bottom wall. Therefore, a connection between the support structure and the top wall and the bottom wall can be designed based on reliability and stress distribution of a support position to be supported. For example, the support structure may be fastened to the top wall and/or the bottom wall by welding or gluing. Alternatively, the support structure may also be integrally formed with an inner cavity of a housing, so that not only the support structure is firmly connected to a wall surface of the cavity, but also a process of the heat sink is simplified.

Therefore, in one aspect, the support structure can maintain a shape of the substrate. This minimizes a possibility of affecting flow-back when a longitudinal spacing between the top wall and the bottom wall is shortened because the substrate is deformed under action of an external force. In another aspect, the support structure can shorten time required for converting the liquid refrigerating medium into the gaseous refrigerating medium, thereby strengthening boiling and accelerating flow-back.

In a possible implementation, a groove is disposed on a bottom wall of the heat sink and/or an outer surface of the support structure.

Therefore, the groove is disposed close to a wall surface of the heat generation element and/or the outer surface of the support structure in the cavity, so as to accelerate a process of converting the liquid refrigerating medium into the gaseous refrigerating medium, and greatly shorten the time required for vaporization of the refrigerating medium, thereby strengthening evaporation and vaporization of the refrigerating medium.

In a possible implementation, the heat sink further includes a first capillary structure, and the first capillary structure is located in the cavity and connected to the bottom wall. For example, the first capillary structure may be a tow, a silk mesh, grog, or a fiber.

Therefore, in one aspect, it is beneficial for the condensed refrigerating medium to flow back from a cooling region to the second evaporation region, thereby avoiding a problem that the heat generated by the heat generation element cannot be dissipated in time due to a small quantity of liquid refrigerating media in the second evaporation region, and improving heat dissipation performance of the heat dissipation member. In another aspect, this can accelerate the process of converting the liquid refrigerating medium into the gaseous refrigerating medium, and greatly shorten the time required for vaporization of the refrigerating medium, thereby strengthening evaporation and vaporization of the refrigerating medium.

In a possible implementation, the heat sink further includes a second capillary structure, the second capillary structure is located in the cavity, one end of the second capillary structure is connected to the first capillary structure, and the other end of the second capillary structure is connected to the top wall. For example, the second capillary structure may be a tow, a silk mesh, grog, or a fiber.

Therefore, in one aspect, it is beneficial for the condensed refrigerating medium to flow back from a cooling region to the second evaporation region, thereby avoiding the problem that the heat generated by the heat generation element cannot be dissipated in time due to a small quantity of liquid refrigerating media in the second evaporation region, and improving heat dissipation performance of the heat dissipation member. In another aspect, this can accelerate the process of converting the liquid refrigerating medium into the gaseous refrigerating medium, and greatly shorten the time required for vaporization of the refrigerating medium, thereby strengthening evaporation and vaporization of the refrigerating medium.

In a possible implementation, there is one heat dissipation structure: or
there are a plurality of heat dissipation structures, and two adjacent heat dissipation structures are spaced from each other at an included angle.

Therefore, a quantity of heat dissipation structures is adjusted, to implement diversified fin sheet layouts, and further implement, by fully utilizing the fin sheet layouts, low thermal resistance, uniform temperature heat conduction, and better convection heat exchange performance of the fin sheet.

In a possible implementation, the heat sink further includes a reinforcement structure, and a through-flow channel communicated with the cooling flow channel is disposed in the reinforcement structure; and
the reinforcement structure is disposed between the connection part and the substrate; or
the reinforcement structure is disposed between the connection part and the fin part: or
the reinforcement structure is disposed between the fin part and the substrate.

Therefore, secondary processing is performed on the heat dissipation structure, so that an overall heat exchange area of the heat sink can be effectively increased, and overall strength of the heat sink can be improved. For example, a connection form between the reinforcement structure and the heat dissipation structure and the substrate may be but is not limited to welding, bonding, or through-hole expansion.

In a possible implementation, the heat dissipation structure is folded and formed by bending one rib at least once: or the heat dissipation structure is folded and formed by splicing a plurality of ribs and folding at least once.

It should be noted that a case in which folding and forming is performed by splicing the plurality of ribs and bending at least once includes a case in which the plurality of ribs are spliced together after being bent, and also includes a case in which the plurality of ribs are bent after being spliced together.

Therefore, based on an actual heat dissipation requirement and a space layout of the heat sink, in an application scenario in which the heat dissipation requirement is low and the space layout is narrow, the heat dissipation structure folded and formed by using a small quantity of ribs is arranged. However, in an application scenario in which the heat dissipation requirement is high and the space layout is broad, the heat dissipation structure folded and formed by using a large quantity of ribs is arranged. That is, the heat dissipation structure can be disposed to adapt to a multi-scenario application requirement, have high flexibility, and have a wide application range.

In a possible implementation, the ground is used as a reference plane, and the substrate and the reference plane are disposed in parallel or at an included angle.

That is, the heat sink may be disposed in a horizontal direction, or may be disposed in a vertical direction, or may be disposed obliquely in an angle range between the horizontal direction and the vertical direction.

Specifically, the heat sink being disposed in the horizontal direction may be understood as that the ground is used as the reference plane, a heat source surface of the heat generation element and the reference plane are disposed in parallel, and therefore the substrate and the reference plane are disposed in parallel, so that a connection structure fastened to the substrate is also in a same direction as the substrate, and further the heat sink is integrally formed into a horizontally arranged layout. Therefore, the evaporation region and the condensation region in the heat sink can be arranged up and down in a direction of gravity. The refrigerating medium absorbs heat in the evaporation region and becomes vapor, the vapor flows to the condensation region under a pressure difference of the height gradient and condenses into liquid in the condensation region, and the condensed liquid can flow back to the evaporation region under action of gravity, which is cyclically performed to form the complete working substance circulation, so that the heat sink can improve temperature equalization performance of the whole heat sink through the gas-liquid phase change, thereby enhancing the heat conduction capability of the whole heat sink.

The heat sink being disposed in the vertical direction may be understood that the ground is used as the reference plane, a heat source surface of the heat generation element is disposed vertically to the reference plane, and therefore the substrate is disposed vertically to the reference plane, so that a connection structure fastened to the substrate is also in a same direction as the substrate, and the heat sink is integrally formed into a vertically arranged layout. Therefore, the substrate vertically disposed at a bottom can enable wind to enter from the bottom under a natural heat dissipation condition to convect and exchange heat with air, thereby effectively meeting a requirement of disposing the substrate in the vertical direction in the heat sink, such as a base station, a power supply, or a photovoltaic inverter.

The heat sink being disposed obliquely may be understood as that the ground is used as the reference surface, a heat source surface of the heat generation element and the reference surface are disposed at an angle, and therefore the substrate and the reference surface are disposed at the angle, so that a connection structure fastened to the substrate is also in a same direction as the substrate, and further the heat sink is integrally formed into a obliquely arranged layout, where the angle range between the substrate and the reference plane may be within a range of 0° to 90°. Therefore, the substrate has the specific angle with the direction of the gravity, and presents a form in which the bottom is obliquely disposed. This structure can meet a requirement of oblique disposition because a transmit signal is covered by a tilt angle, can meet a key requirement of convenient installation and flexible deployment of the heat sink, and can effectively improve core competitiveness of the heat sink.

Based on the foregoing description, the heat sink can effectively adapt to different layouts, thereby improving comprehensive performance on the basis of continuous increase of transmit power and high integration, fully addressing a challenge of high power and high heat dissipation density, meeting the multi-scenario application requirement (such as outdoor harsh environments of wind, snow, heat, wind, sand, and salt spray), and having good reliability.

In a possible implementation, a cross-sectional shape of the fin part along a height direction of the fin part includes one or a combination of more of a linear shape, an L shape, an arc shape, or a serpentine shape, and the height direction of the fin part is a direction perpendicular to the substrate.

According to a second aspect, this disclosure further provides a communication device. The communication device includes a heat generation element and the heat sink described above, and the heat generation element is disposed on a side that is of the substrate and that is away from the heat dissipation structure.

DESCRIPTION OF EMBODIMENTS

For ease of understanding, terms in embodiments of this disclosure are first explained.

The term "and/or" describes only an association relationship for describing associated objects and represents that three relationships may exist. For example, A and/or B may represent the following three cases: Only A exists, both A and B exist, and only B exists.

"A plurality of" means "two or more".

Fastening should be understood broadly. For example, that A is fastened to B may be that A is directly connected to B and relative locations do not change after connection, or may be that A is indirectly connected to B by using an intermediate medium and relative locations do not change after connection.

The following clearly describes specific implementations of this disclosure with reference to the accompanying drawings.

An embodiment of this disclosure provides a communication device. The communication device may be but is not limited to a device that can be applied to a communication base station, or a device such as a photovoltaic inverter, a power supply, or a vehicle-mounted power supply. The device that can be applied to the communication base station may be a wireless transceiver device, for example, a remote radio unit (RRU), or a signal processing device, in the communication base station.

Figure 1:
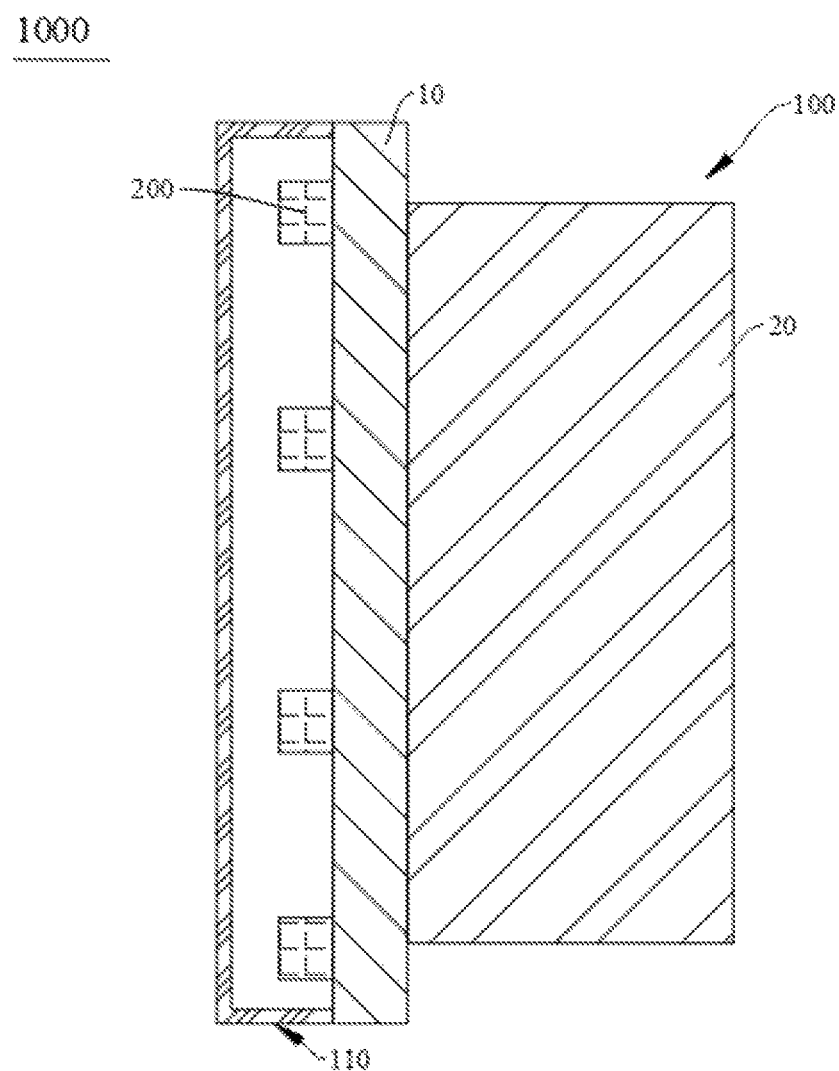
FIG. 1 is a schematic diagram of a structure of a communication device according to an embodiment of this disclosure.
Figure 2:
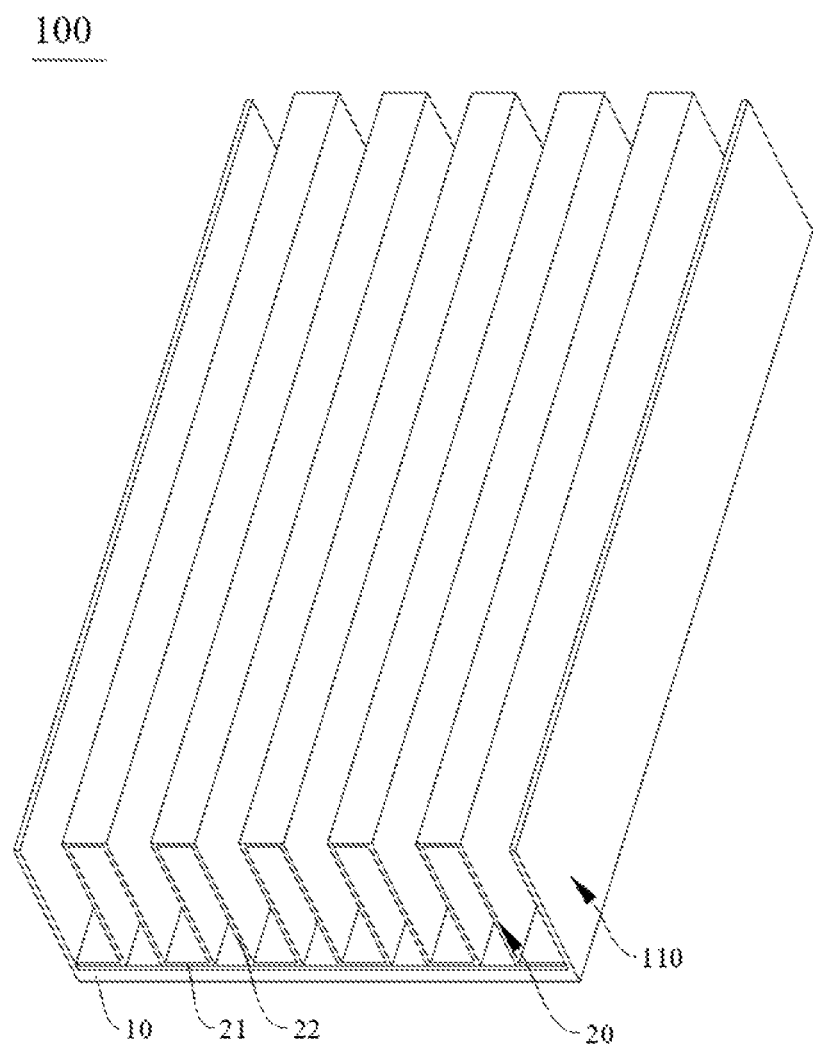
FIG. 2 is a schematic diagram of a structure of a heat sink according to an embodiment of this disclosure.
Figure 3:
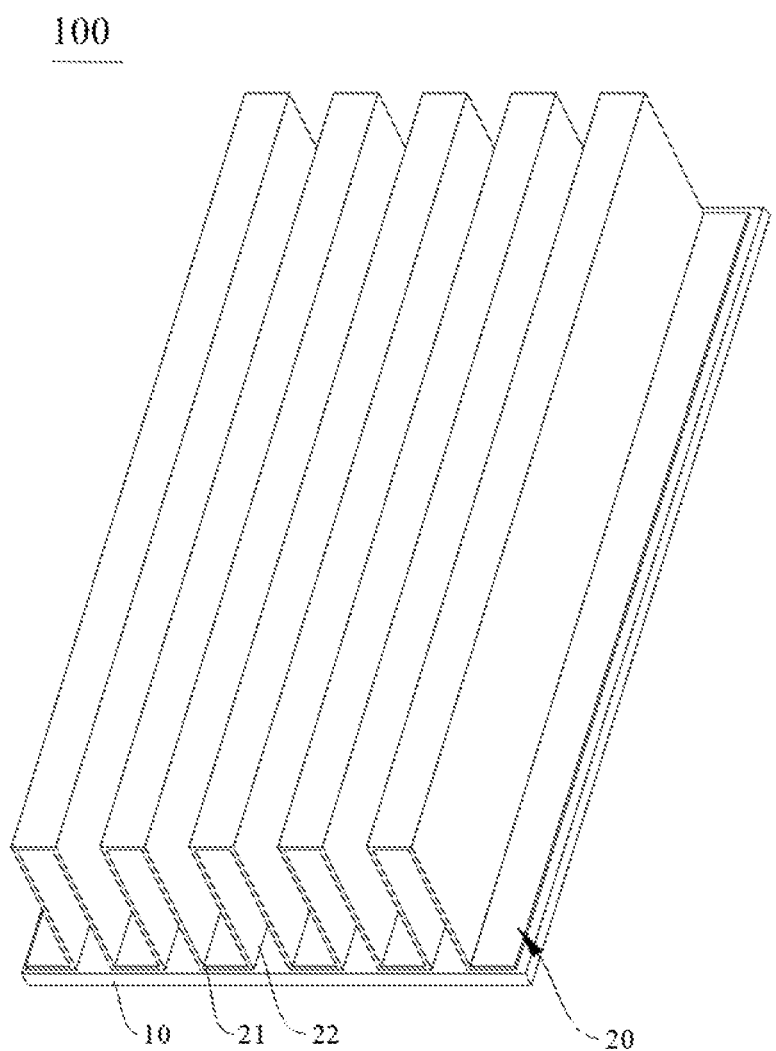
FIG. 3 is a schematic diagram of another structure of a heat sink according to an embodiment of this disclosure.

Referring to FIG. 1, a communication device 1000 includes a heat generation element 200 and a heat sink 100 that are fastened to each other. The heat generation element 200 may be understood as a structure member that generates heat in a working process of the communication device 1000, and the heat generation element 200 may be attached to the heat sink 100 to transfer the heat to the heat sink 100. Then, the heat is dissipated to an external environment through heat radiation of the heat sink 100, natural convection, or air-cooled heat dissipation of a fan. A heat balance of the heat generation element 200 directly affects working performance of the communication device 1000. For example, overheating causes the communication device 1000 to fail. The heat sink 100 may be understood as a structure member that can conduct, diffuse, or exchange the heat generated by the heat generation element 200, and dissipate the heat from the heat generation element 200. The heat sink 100 can minimize a possibility that a temperature of the heat generation element 200 is excessively high and affects normal working of the communication device 1000. For example, the heat generation element 200 may be one or a combination of more of a circuit board, a chip, a power supply, or the like.

It may be understood that a quantity of heat generation elements 200 may be selected based on an actual situation, and there may be one or more heat generation elements 200. That is, when there is one heat generation element 200, the heat sink 100 may be a single heat source heat sink. When there are a plurality of heat generation elements 200, the heat sink 100 may be a multi-heat source heat sink. The plurality of heat generation elements 200 may be uniformly spaced from each other on one side of a substrate 10, or may be non-uniformly spaced from each other on one side of a substrate 10, and may be flexibly adjusted based on a hardware form and a layout of the communication device 1000. Therefore, the heat sink 100 can meet heat dissipation requirements of a single heat source and a multi-heat source, and can be more appropriate for a multi-scenario application. This helps improve comprehensive performance of the communication device 1000.

In a specific application scenario, the communication device 1000 may be a wireless transceiver device. There may be a plurality of heat generation elements 200. The plurality of heat generation elements 200 are spaced from each other on one side of the heat sink 100. The plurality of heat generation elements 200 may be respectively a duplexer (Dup), a power amplifier (PA), and a transmitter (TRX).

In addition, there may be one or more heat sinks 100. Specifically, in an actual application, one heat sink 100 may be used as a single heat sink. Alternatively, there may be a plurality of heat sinks 100 that are used in series up and down. A series connection form may be simple physical stacking, or may be a series connection structure formed by welding, bonding, or integrated processing. This is not strictly limited in this embodiment of this disclosure.

It should be noted that FIG. 1 is merely intended to schematically describe a connection relationship between the heat generation element 200 and the heat sink 100, and is not intended to specifically limit connection positions, specific structures, and quantities of devices. A structure shown in this embodiment of this disclosure does not constitute a specific limitation on the communication device 1000. In some other embodiments of this disclosure, the communication device 1000 may include more or fewer components than those shown in the figure, or combine some components, or split some components, or have different component arrangements. The components shown in the figure may be implemented by hardware, software, or a combination of software and hardware.

Referring to FIG. 1, FIG. 2, FIG. 3, FIG. 4, and FIG. 5, the heat sink 100 includes the substrate 10, a heat dissipation structure 20, and a refrigerating medium 30. The substrate 10 may be understood as a carrier of the heat dissipation structure 20 and the heat generation element 200. That is, the substrate 10 may provide functions such as an electrical connection, protection, support, heat dissipation, and assembly for the heat generation element 200, or may be used as a heat conduction element to conduct the heat of the heat generation element 200 to the heat dissipation structure 20, so that the heat dissipation structure 20 implements its heat dissipation effect. In addition, the substrate 10 may also be a component of a housing 110 in the heat sink 100, and may form a housing structure of the heat sink 100 together with another housing component. The heat dissipation structure 20 may be understood as a primary heat dissipation structure 20, namely, a heat dissipation fin, in the heat sink 100. The heat generated by the heat generation element 200 can be effectively dissipated to the external environment in time by using good heat dissipation effect of the heat dissipation structure 20. The refrigerating medium 30 may be understood as a fluid working medium that can have dual functions of gas-liquid phase change and heat conduction, and can implement complete working substance circulation through action of the gas-liquid phase change. For example, the refrigerating medium 30 may be one or a combination of more of water, inert fluoride liquid, a refrigerant R134a (1,1,1,2-tetrafluoroethane), a refrigerant R245fa (1,1,1,3,3-pentafluoropropane), a refrigerant R1234ze (1,1,1,3-tetrafluoropropene), a refrigerant R1233zd (1-chlorine-3,3,3-trifluoropropene).

Figure 6:
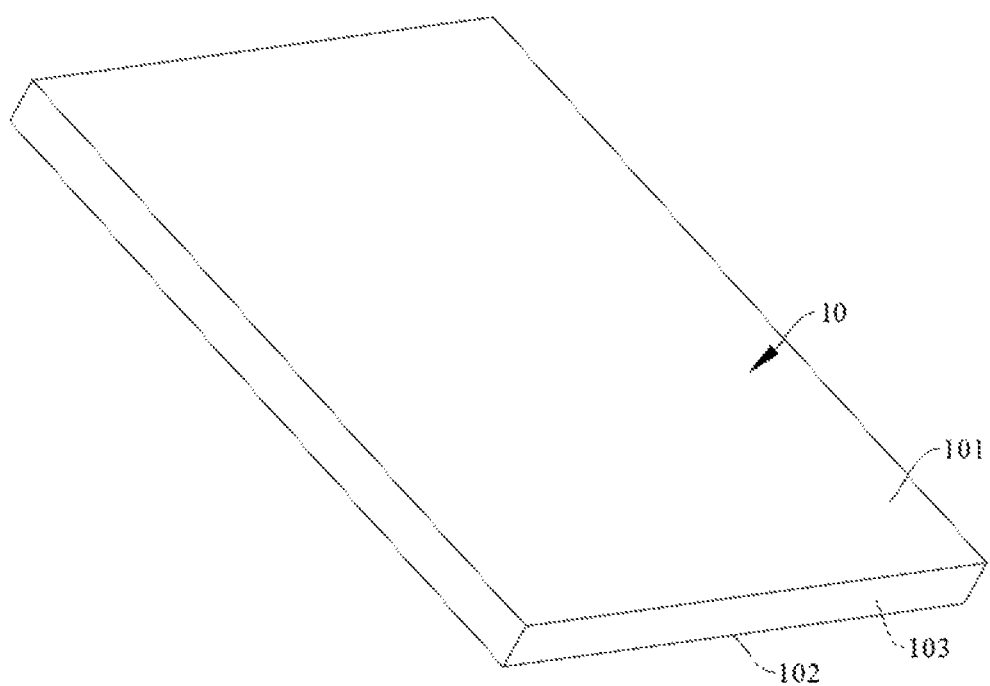
FIG. 6 is a schematic diagram of a structure of a substrate in a heat sink according to a first embodiment of this disclosure.

Referring to FIG. 6, the substrate 10 includes a first surface 101, a second surface 102, and four side walls 103 connected between the first surface 101 and the second surface 102. The first surface 101 and the second surface 102 are disposed opposite to each other, and the four side walls 103 are sequentially connected to form a peripheral side surface of the substrate 10. The first surface 101 may be understood as a surface connected to the heat dissipation structure 20, and the second surface 102 may be understood as a surface connected to the heat generation element 200. That is, the heat dissipation structure 20 is disposed on the first surface 101, and the heat generation element 200 is disposed on the second surface 102, that is, a side that is of the substrate 10 and that is away from the heat dissipation structure 20.

Therefore, the heat dissipation structure 20 and the heat generation element 200 are arranged on the first surface 101 and the second surface 102 respectively, to maximum a heat conduction function of the substrate 10, and effectively transfer the heat of the heat generation element 200 to the heat dissipation structure 20. The heat of the heat generation element 200 is dissipated to the external environment by using the heat dissipation effect of the heat dissipation structure 20, to implement a heat dissipation function of the heat sink 100.

For example, a material of the substrate 10 may include aluminum, aluminum alloy, copper, graphite, ceramic, or a high-molecular plastic, and the material of the substrate 10 may be selected based on an actual assembly requirement. This is not strictly limited in this embodiment of this disclosure.

Still referring to FIG. 2, FIG. 3, FIG. 4, and FIG. 5, in this embodiment of this disclosure, the heat dissipation structure 20 is fastened to the substrate 10. Specifically, the heat dissipation structure 20 is connected to the first surface 101 of the substrate 10. In a possible implementation, the substrate 10 and the heat dissipation structure 20 are of an integrated structure. For example, the heat dissipation structure 20 and the substrate 10 may be connected to each other by welding, gluing, crimping, or screw fastening to be the integrated structure.

Therefore, in one aspect, production time and costs can be saved, and processing and production efficiency of the heat sink 100 can be improved. In another aspect, after overall heat dissipation performance of the heat sink 100 is improved, while an existing heat consumption level is maintained, a fin height of a fin part in the heat sink 100 can be reduced due to improvement of heat dissipation performance. This reduces a volume and a weight of the entire heat sink 100 in a disguised form. In other words, when heat dissipation requirements are the same, a structure of the heat sink 100 provided in this embodiment of this disclosure is smaller than a structure of that in the conventional technology.

Figure 4:
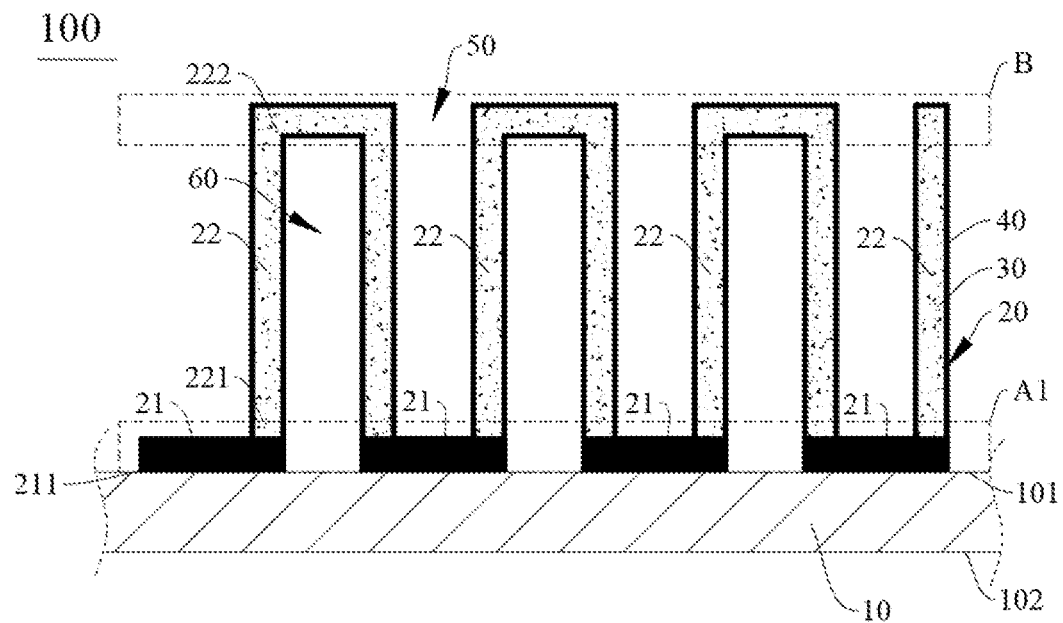
FIG. 4 is a schematic cross-sectional diagram of a heat sink according to a first embodiment of this disclosure.
Figure 5:
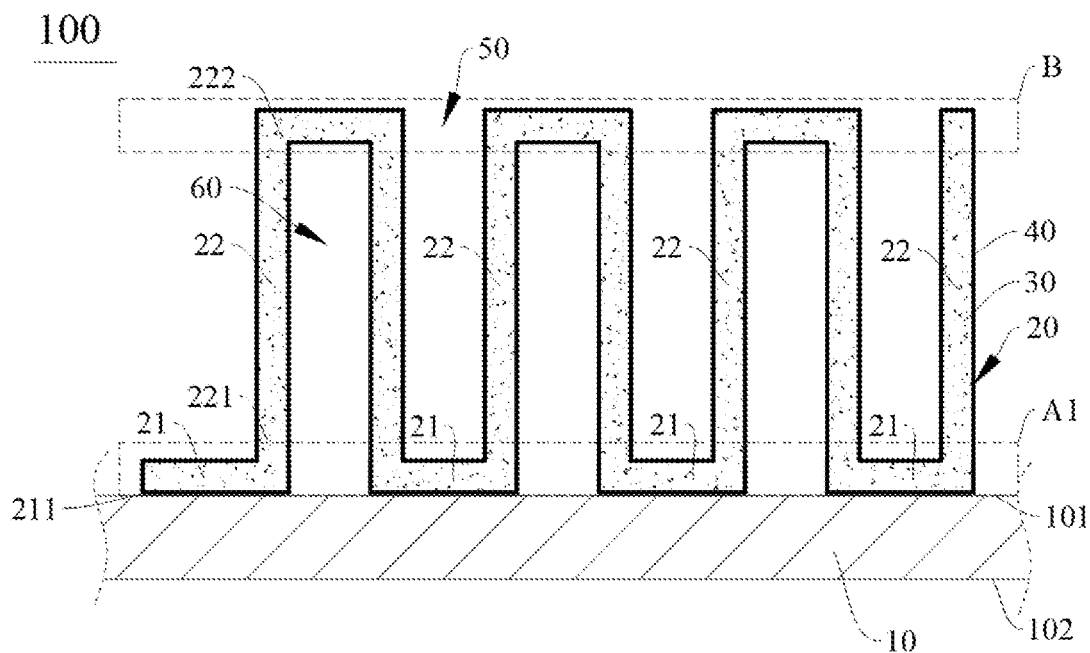
FIG. 5 is another schematic cross-sectional diagram of a heat sink according to a first embodiment of this disclosure.
Figure 7:
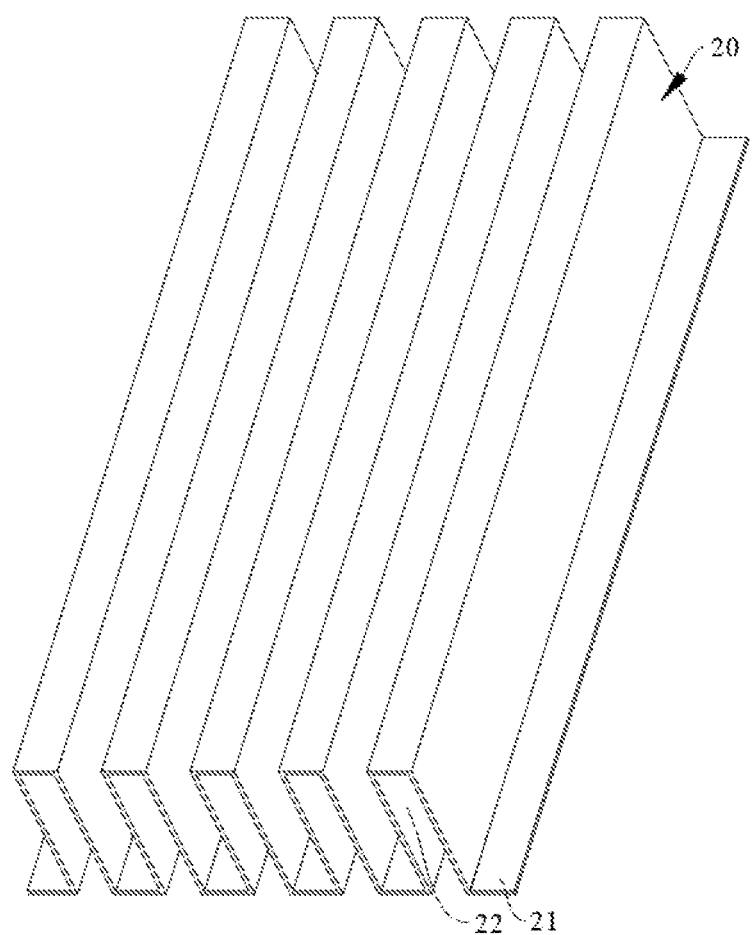
FIG. 7 is a schematic diagram of a structure of a heat dissipation structure in a heat sink according to an embodiment of this disclosure.

Referring to FIG. 4, FIG. 5, and FIG. 7, in this embodiment of this disclosure, the heat dissipation structure 20 is of an integrated structure formed by bending at least once, and a cooling flow channel 40 is disposed in the heat dissipation structure 20. The cooling flow channels 40 may be distributed at a plurality of positions of the heat dissipation structure 20: or the cooling flow channel 40 may be distributed in the heat dissipation structure 20, that is, an extension path of the cooling flow channel 40 is the same as an extension path of the heat dissipation structure 20. The refrigerating medium 30 flows in the cooling flow channel 40 to dissipate the heat from the substrate 10. That is, the extension path of the cooling flow channel 40 is the same as a bending path of the heat dissipation structure 20. For example, a material of the heat dissipation structure 20 may include aluminum, aluminum alloy, copper, graphite, ceramic, or a high-molecular plastic, and the material of the heat dissipation structure 20 may be selected based on an actual assembly requirement. This is not strictly limited in this embodiment of this disclosure.

It may be understood that the heat dissipation structure 20 may be a primary heat dissipation component in the heat sink 100 formed by bending a rib 201 with the cooling flow channel 40 at least once based on an actual heat dissipation requirement of the heat sink 100 after the rib 201 with the cooling flow channel 40 is processed at one time. The bending may also be understood as folding, that is, the rib 201 with the cooling flow channel 40 is folded at least once. Folding cases may include a case in which one part and the other part are adjacent to each other, or may include a case in which one part and the other part are spaced apart. It should be understood that the cooling flow channel 40 may be folded with folding of the rib 201, for example, presented in a bent form following a bent form of the rib 201. That is, a cross-section form of the heat dissipation structure 20 may be a sandwich-like form of "plate body-flow channel-plate body".

For example, the rib 201 may be made by blow molding or impact molding. The inside cooling flow channel 40 may also be made by blow molding or impact molding.

Figure 8:
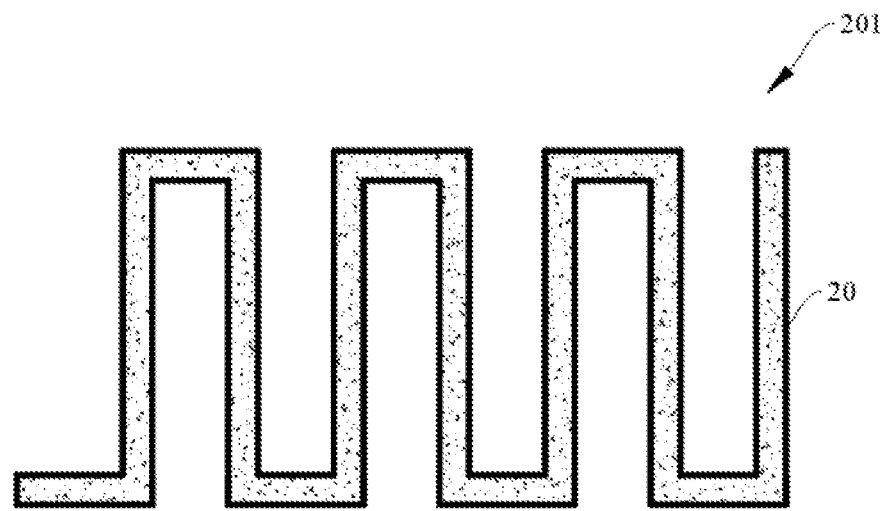
FIG. 8 is a schematic cross-sectional diagram of a heat dissipation structure in a heat sink according to an embodiment of this disclosure.

Referring to FIG. 8, in a possible implementation, the heat dissipation structure 20 may be folded and formed by bending one rib 201 at least once.

Figure 9:
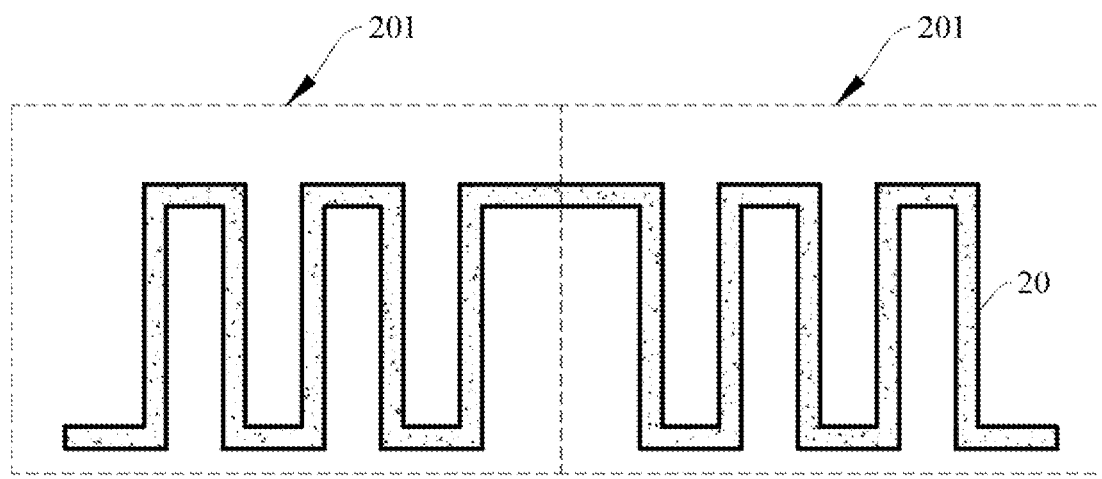
FIG. 9 is another schematic cross-sectional diagram of a heat dissipation structure in a heat sink according to an embodiment of this disclosure.

Referring to FIG. 9, in another possible implementation, the heat dissipation structure 20 may be folded and formed by splicing a plurality of ribs 201 and bending at least once. It should be noted that a case in which folding and forming is performed by splicing the plurality of ribs 201 and bending at least once includes a case in which the plurality of ribs 201 are spliced together after being bent, and also includes a case in which the plurality of ribs 201 are bent after being spliced together.

Therefore, based on the actual heat dissipation requirement and a space layout of the heat sink 100, in an application scenario in which the heat dissipation requirement is low and the space layout is narrow, the heat dissipation structure 20 folded and formed by using a small quantity of ribs 201 is arranged. However, in an application scenario in which the heat dissipation requirement is high and the space layout is broad, the heat dissipation structure 20 folded and formed by using a large quantity of ribs 201 is arranged. That is, the heat dissipation structure 20 can be disposed to adapt to a multi-scenario application requirement, have high flexibility, and have a wide application range.

Based on the foregoing description, it should be understood that the heat dissipation structure 20 can be processed, folded, and formed once to form the integrated structure, so that the heat dissipation structure 20 serves as the heat dissipation fin, namely, the primary heat dissipation component, of the heat sink 100, and is well presented as a form required for heat dissipation of the heat generation element 200. In one aspect, the heat dissipation structure 20 can be used as whole to be connected to the substrate 10, which effectively avoids a complex assembly process in which a plurality of heat dissipation fins need to be processed independently and sequentially assembled with the substrate 10 in the conventional technology, helps save production time and costs, and improves processing and production efficiency of the heat sink 100. In another aspect, a connection part in the heat dissipation structure 20 can be connected to the substrate 10. This saves a connection piece for fastening the heat dissipation fin that needs to be disposed between the substrate 10 and the heat dissipation fin in the conventional technology, greatly reduces a space occupied by the heat dissipation structure 20, and reduces wind resistance of the heat sink 100. It is beneficial to a development trend of miniaturization of the heat sink 100, so that the heat sink 100 is easy to transport and install.

In addition, the cooling flow channel 40 is disposed inside the heat dissipation structure 20, so that the heat dissipation structure 20 can innovatively have a heat dissipation characteristic of a two-phase temperature equalizing plate. In one aspect, heat of a high-power heat source conducted by the substrate 10 can be effectively expanded, and heat conduction thermal resistance of the heat dissipation structure 20 and a temperature of the substrate 10 can be reduced, so that the heat dissipation structure 20 has a good heat conduction temperature difference and heat transfer efficiency, thereby greatly improving heat conduction performance of the heat dissipation structure 20. In another aspect, a heat conduction capability of the heat dissipation structure 20 can be improved, so that the volume, the weight, and thermal resistance of the heat sink 100 can be correspondingly reduced when heat consumption is dissipated under same conditions, that is, same heat dissipation targets are achieved, thereby saving material management costs of the heat dissipation structure 20 and having good heat dissipation reliability.

The cooling flow channels 40 can be distributed in the plurality of positions of the heat dissipation structure 20, that is, the cooling flow channels 40 are intermittently disposed in the heat dissipation structure 20, and may be distributed in the plurality of positions of the heat dissipation structure 20 based on a requirement. Alternatively, the extension path of the cooling flow channel 40 is the same as a bending path of the heat dissipation structure 20, that is, the cooling flow channel 40 extends along an extension direction of the heat dissipation structure 20, so that the cooling flow channel 40 can be used as a whole throughout the heat dissipation structure 20. In addition, only one liquid filling port is required to fill the refrigerating medium 30 for the cooling flow channel 40, which avoids a complex structure in which a flow channel needs to be arranged for each of a plurality of heat dissipation fins and a liquid filling port needs to fill the refrigerating medium 30 for the flow channel in the conventional technology. Therefore, the cooling flow channel 40 has an excellent characteristic of independent liquid filling, which is beneficial to improving heat dissipation benefits and processing and manufacturing efficiency of the heat sink 100.

Figure 10:
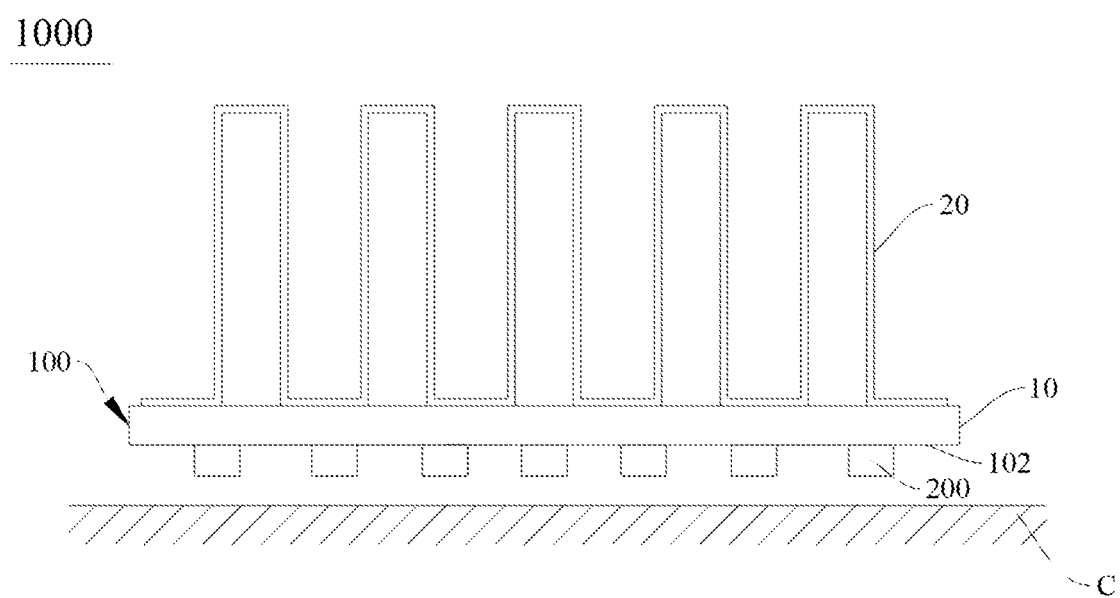
FIG. 10 is a schematic diagram of a structure of a heat sink disposed horizontally according to an embodiment of this disclosure.
Figure 11:
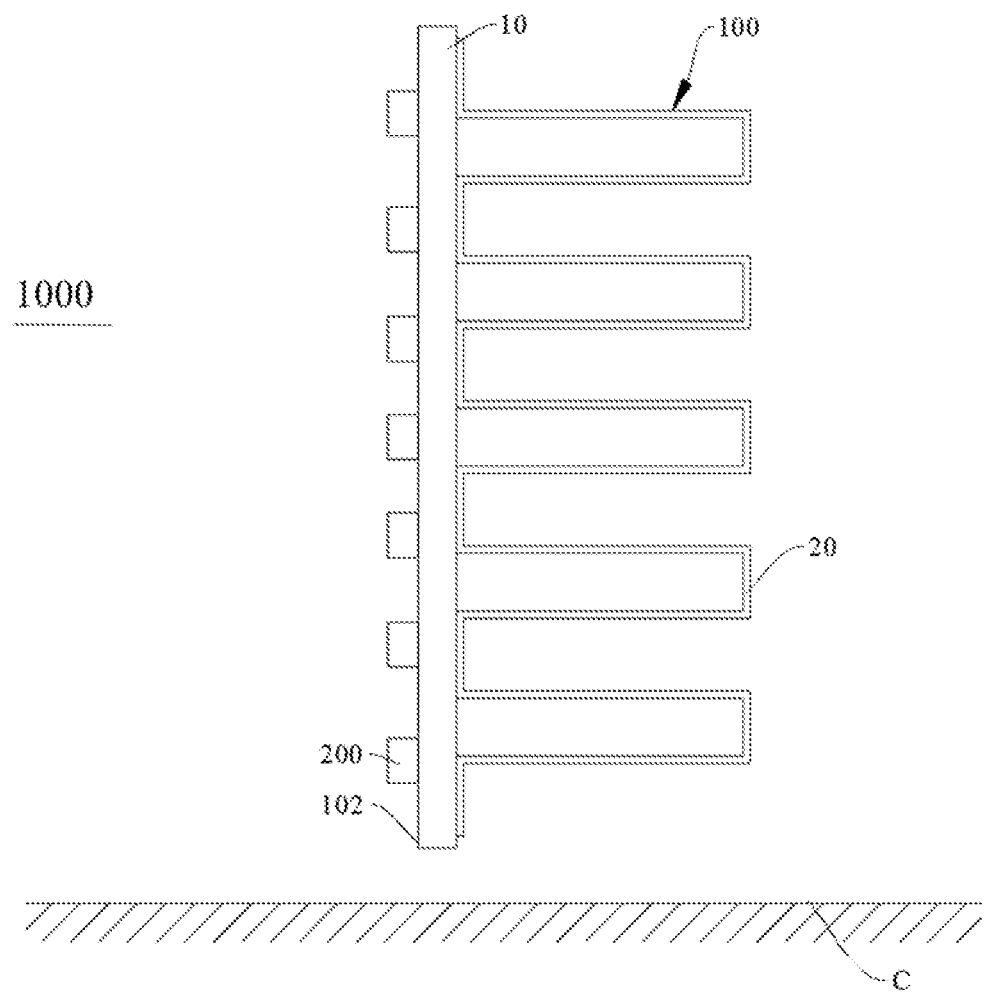
FIG. 11 is a schematic diagram of a structure of a heat sink disposed vertically according to an embodiment of this disclosure.
Figure 12:
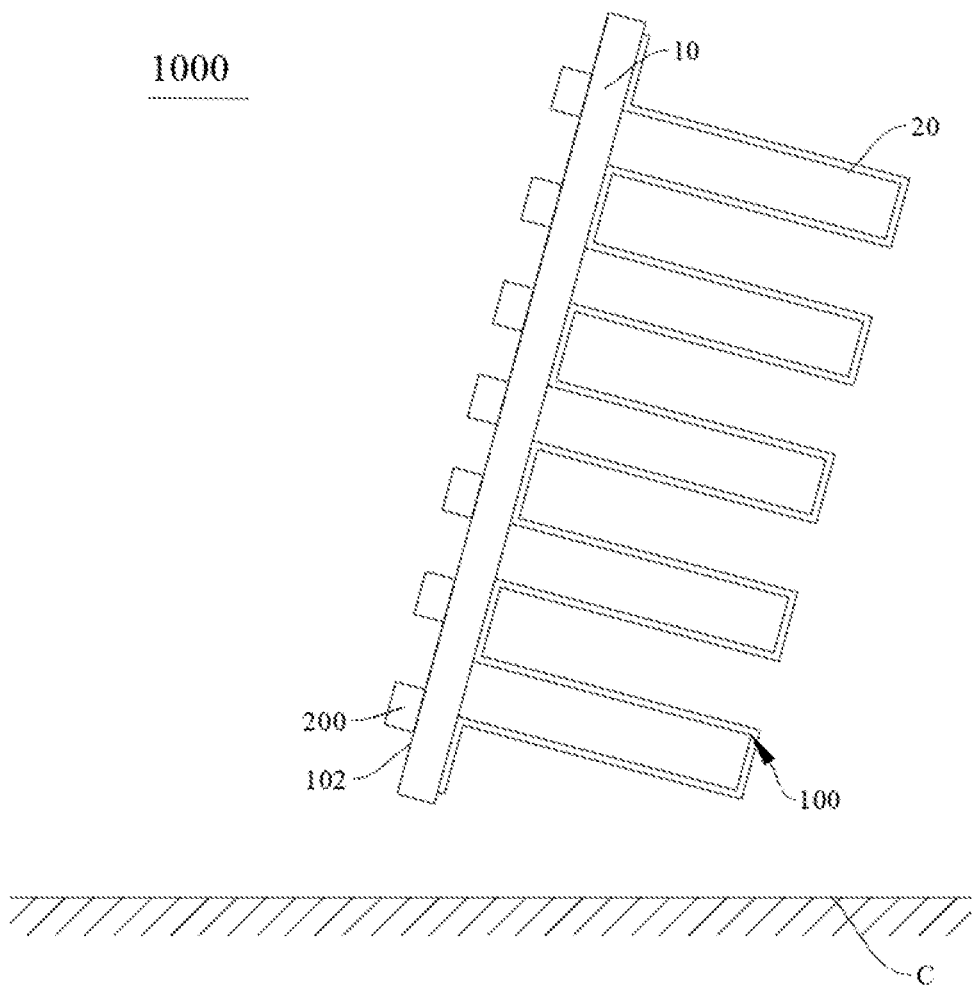
FIG. 12 is a schematic diagram of a structure of a heat sink disposed obliquely according to an embodiment of this disclosure.
Figure 13:
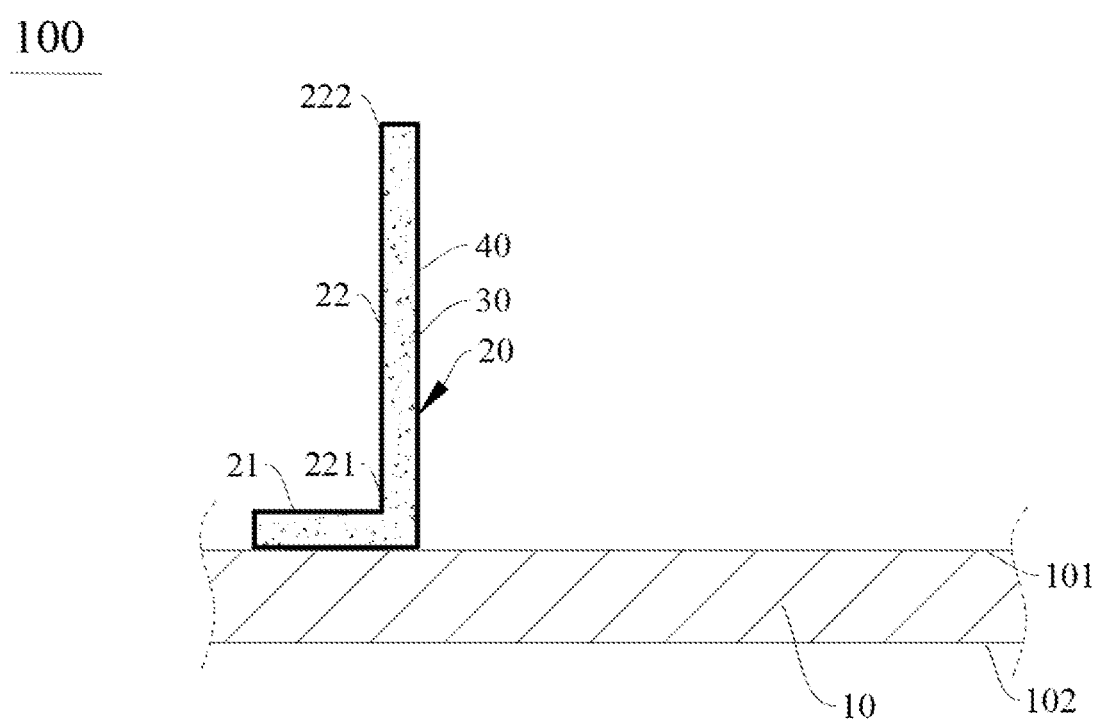
FIG. 13 is a schematic cross-sectional diagram of a first implementation of a heat dissipation structure in a heat sink according to a first embodiment of this disclosure.
Figure 14:
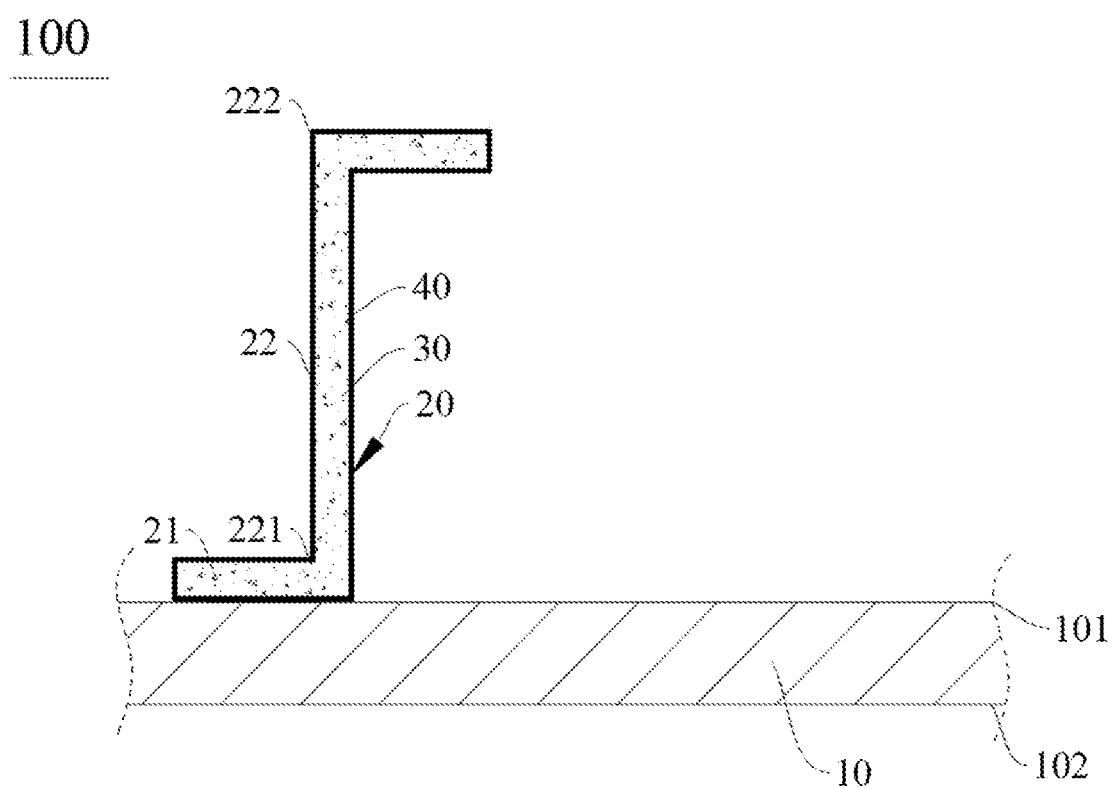
FIG. 14 is another schematic cross-sectional diagram of a first implementation of a heat dissipation structure in a heat sink according to a first embodiment of this disclosure.
Figure 15:
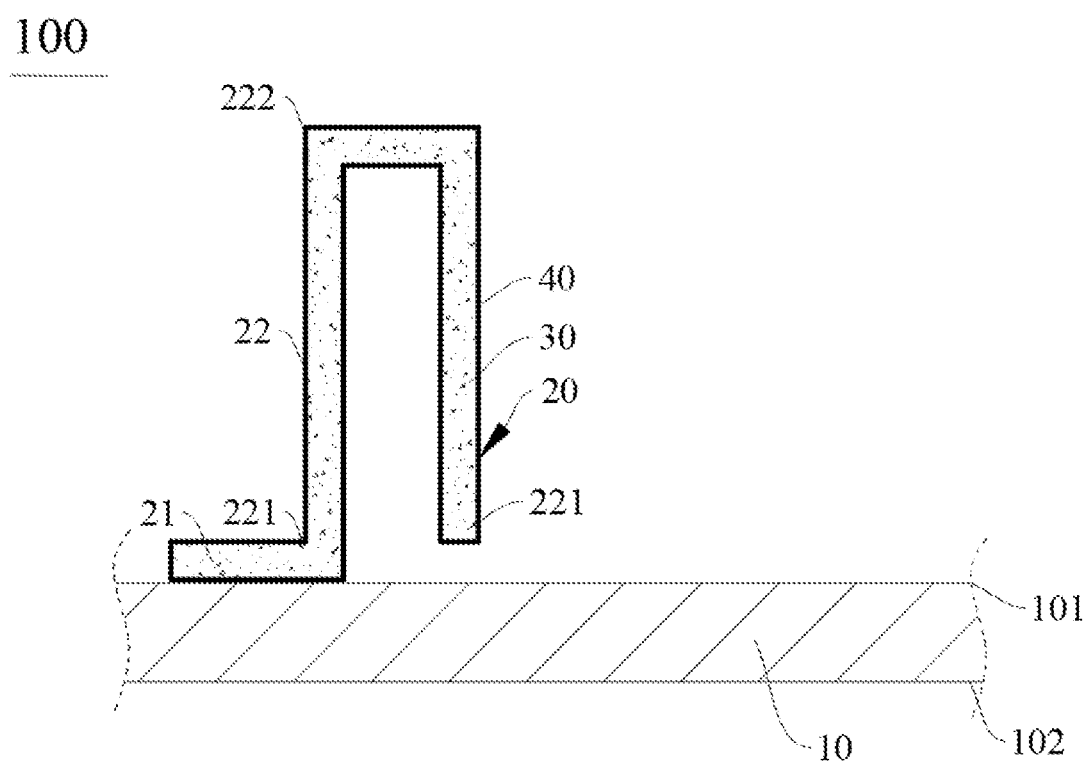
FIG. 15 is still another schematic cross-sectional diagram of a first implementation of a heat dissipation structure in a heat sink according to a first embodiment of this disclosure.
Figure 16:
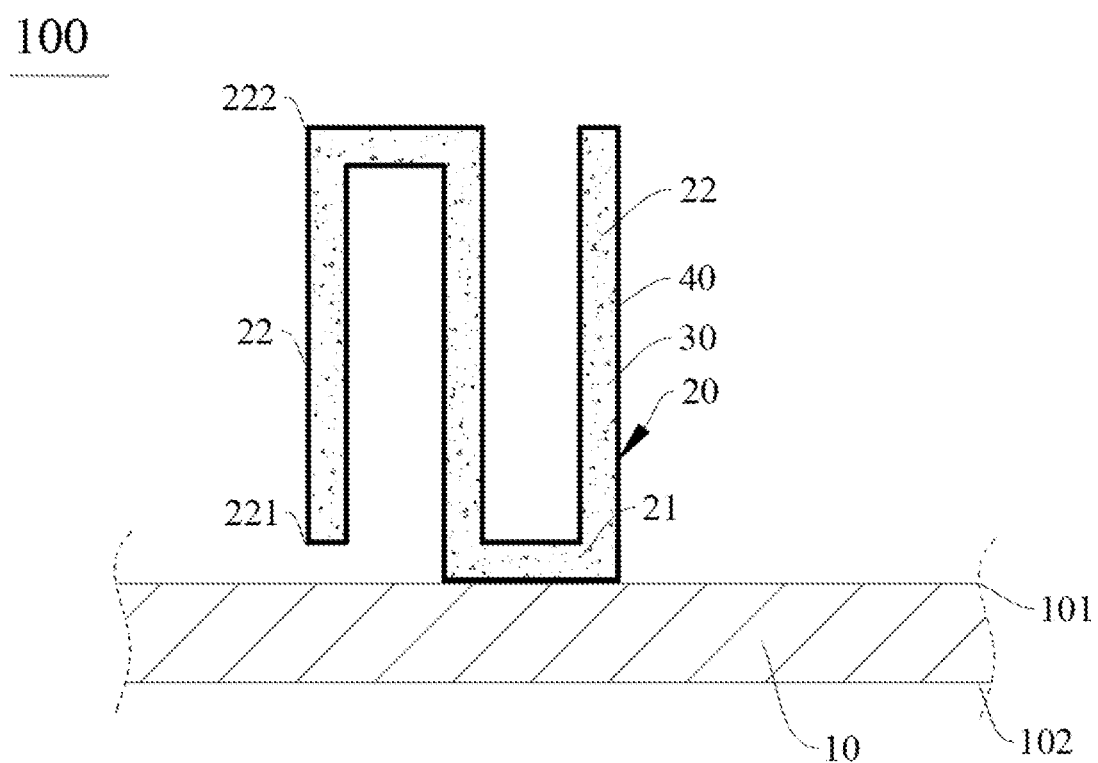
FIG. 16 is a schematic cross-sectional diagram of a second implementation of a heat dissipation structure in a heat sink according to a first embodiment of this disclosure.
Figure 17:
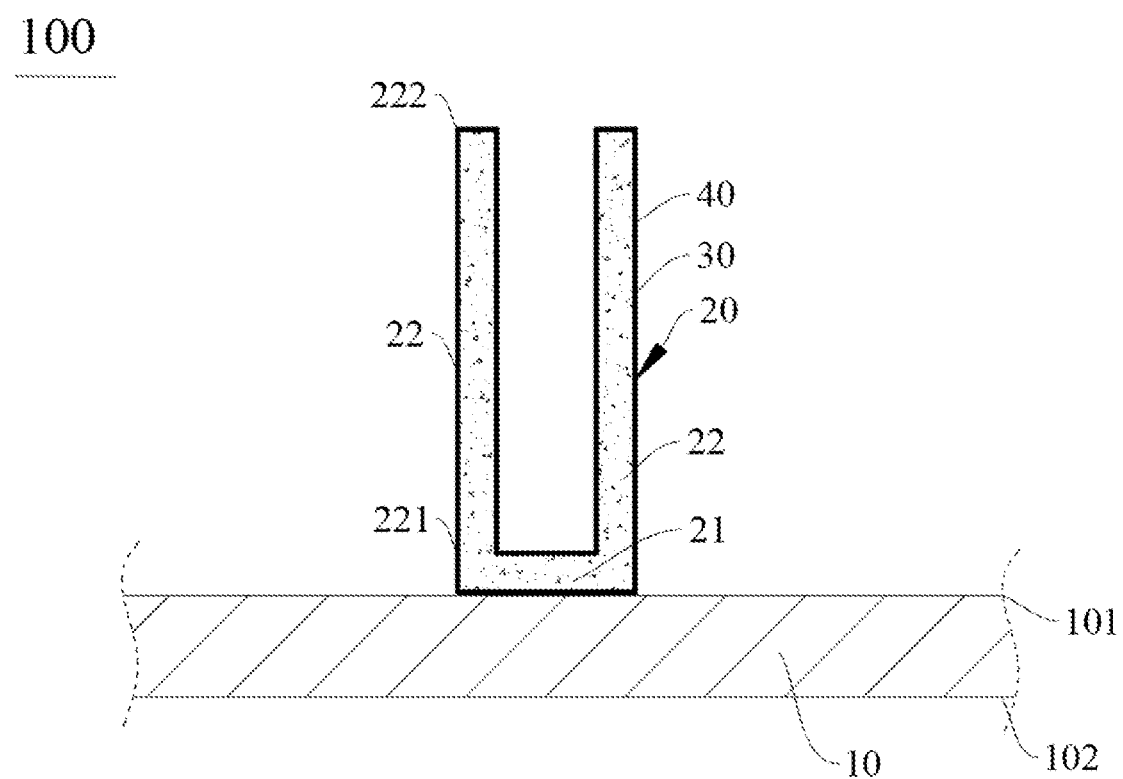
FIG. 17 is another schematic cross-sectional diagram of a second implementation of a heat dissipation structure in a heat sink according to a first embodiment of this disclosure.

Referring to FIG. 10, FIG. 11, and FIG. 12, in this embodiment of this disclosure, the heat sink 100 may be disposed in a horizontal direction, or may be disposed in a vertical direction, or may be disposed obliquely in an angle range between the horizontal direction and the vertical direction.

Specifically, referring to FIG. 10, the heat sink 100 being disposed in the horizontal direction may be understood as that the ground is used as a reference plane C, a heat source surface (namely, the second surface 102 of the substrate 10) of the heat generation element 200 and the reference plane C are disposed in parallel, and therefore the substrate 10 and the reference plane C are disposed in parallel, so that a connection structure fastened to the substrate 10 is also in a same direction as the substrate 10, and further the heat sink 100 is integrally formed into a horizontally arranged layout. Therefore, an evaporation region and a condensation region in the heat sink 100 can be arranged up and down in a direction of gravity. The refrigerating medium 30 absorbs heat in the evaporation region and becomes vapor, the vapor flows to the condensation region under a pressure difference of a height gradient and condenses into liquid in the condensation region, and the condensed liquid can flow back to the evaporation region under action of gravity, which is cyclically performed to form the complete working substance circulation, so that the heat sink 100 can improve temperature equalization performance of the whole heat sink 100 through gas-liquid phase change, thereby enhancing a heat conduction capability of the whole heat sink 100.

Referring to FIG. 11, the heat sink 100 being disposed in the vertical direction may be understood that the ground is used as a reference plane C, a heat source surface (namely, the second surface 102 of the substrate 10) of the heat generation element 200 is disposed vertically to the reference plane C, and therefore the substrate 10 is disposed vertically to the reference plane C, so that a connection structure fastened to the substrate 10 is also in a same direction as the substrate 10, and the heat sink 100 is integrally formed into a vertically arranged layout. Therefore, the substrate 10 vertically disposed at a bottom can enable wind to enter from the bottom under a natural heat dissipation condition to convect and exchange heat with air, thereby effectively meeting a requirement of disposing the substrate 10 in the vertical direction in the heat sink 100, such as a base station, a power supply, or a photovoltaic inverter.

Referring to FIG. 12, the heat sink 100 being disposed obliquely may be understood as that the ground is used as a reference surface C, a heat source surface (namely, the second surface 102 of the substrate 10) of the heat generation element 200 and the reference surface C are disposed at an angle, and therefore the substrate 10 and the reference surface C are disposed at an angle, so that a connection structure fastened to the substrate 10 is also in a same direction as the substrate 10, and further the heat sink 100 is integrally formed into an obliquely arranged layout, where the angle range between the substrate 10 and the reference plane C may be within a range of 0° to 90°. Therefore, the substrate 10 has the specific angle with the direction of the gravity, and presents a form in which the bottom is obliquely disposed. This structure can meet a requirement of oblique disposition because a transmit signal is covered by a tilt angle, can meet a key requirement of convenient installation and flexible deployment of the heat sink 100, and can effectively improve core competitiveness of the heat sink 100.

Based on the foregoing description, the heat sink 100 can effectively adapt to different layouts, thereby improving comprehensive performance on the basis of continuous increase of transmit power and high integration, fully addressing a challenge of high power and high heat dissipation density, meeting a multi-scenario application requirement (such as outdoor harsh environments of wind, snow, heat, wind, sand, and salt spray), and having good reliability.

The following describes in detail connection positions and specific structures of the substrate 10 and the heat sink 100 in this disclosure by using two specific embodiments.

Still referring to FIG. 4 and FIG. 5, in a first embodiment of this disclosure, the substrate 10 is of a solid closed structure. That is, the substrate 10 is a solid plate, and the refrigerating medium 30 flows only in the cooling flow channel 40 in the heat dissipation structure 20. Therefore, strength of the entire substrate 10 is better. In addition, the substrate 10 has a simple structure, and can be applied to a scenario without a high heat dissipation performance requirement. This can improve processing and production efficiency of the entire heat sink 100.

The heat dissipation structure 20 includes a connection part 21 and a fin part 22, and the connection part 21 is connected to the substrate 10. The fin part 22 is bent and connected to the connection part 21, that is, the fin part 22 and the connection part 21 are disposed at an included angle, which is equivalent to that the fin part 22 and the substrate 10 are disposed at an included angle. The included angle between the fin part 22 and the substrate 10 may be within a range of 0° to 180°. For example, the connection part 21 may be linear and extending in a direction parallel to the substrate 10, or the connection part 21 may be arc-shaped. In addition, the connection part 21 may be indirectly connected to the substrate 10 through a connection piece such as solder or glue, or may be directly connected to the substrate 10 by contacting and cooperating.

Specifically, the connection part 21 includes a contact surface 211, and the contact surface 211 is a surface, of the connection part 21, that is disposed opposite, matched, and connected to the first surface 101 of the substrate 10. A fin root 221 of the fin part 22 is connected to the connection part 21: a fin top 222 of the fin part 22 is far away from the connection part 21; and the cooling flow channel 40 extends from the connection part 21 to the fin part 22, and extends between the fin root 221 and the fin top 222. For example, the connection part 21 and the substrate may be connected to each other by welding, gluing, crimping, or screw fastening.

It may be understood that, because the connection part 21 is connected to the substrate 10, the connection part 21 can be in contact with the substrate 10 with the large contact area 211, that is, a whole connection area between the connection part 21 and the substrate 10 can be effectively increased, and a parallel connection form of the connection part 21 and the substrate 10 is simple and flat. This can effectively reduce connection difficulty. In addition, a quantity of connection parts 21 that need to be connected to the substrate 10 can be reduced while the connection area to the substrate 10 is increased, thereby reducing pressure of connection costs and a risk of leakage of the refrigerating medium 30 caused by a large quantity of connection parts 21, and significantly improving connection quality.

The fin part 22 and the connection part 21 are disposed at the included angle, that is, the fin part 22 and the connection part 21 are bent and connected. Therefore, the fin part 22 may be regarded as a bent part in the heat dissipation structure 20, that is, a part protruding from the connection part 21 and a part protruding from the substrate 10. The fin part 22 is disposed, so that an external form requirement of the heat sink 100 can be met in one aspect, and a heat dissipation area can be effectively increased without occupying a larger board surface area in another aspect. Compared with a structure in which heat dissipation fins are not connected intermittently in the solutions of the conventional technology, a continuous integrated structure of the fin part 22 and the connection part 21 is simple and reliable, and can further enlarge a condensation area of the refrigerating medium 30 and promote flow-back of the refrigerating medium 30. Further, on the basis of satisfying a gravity direction gradient required for circulation of gas-liquid phase change, a fin height of the fin part 22 can be effectively reduced, and a volume of the heat sink 100 can be reduced. This can avoid problems of a heavy weight, high wind resistance, and uneasy transportation and installation caused by the increase of the volume of the heat sink 100, and improve a heat dissipation capability per unit volume of the heat sink 100.

In a possible implementation, as shown in FIG. 4, the cooling flow channel 40 is located only at the fin part 22, and extends between the fin root 221 and the fin top 222. That is, the cooling flow channel 40 is distributed only in the fin part 22 that is not in direct contact with the substrate 10. In this setting, the heat dissipation structure 20 can be presented as a structure with a flow channel in part and a solid in part. It is beneficial to multi-scenario application of the heat sink 100, and the heat sink 100 has strong flexibility.

It should be noted that FIG. 4 only schematically shows a distribution possibility of the cooling flow channels 40, and the cooling flow channels 40 may be distributed in one or more fin parts 22 among a plurality of fin parts 22 based on a requirement. The cooling flow channel 40 may be positioned slightly beyond the fin root 221 to enter the connection part 21 or at a distance from the connection part 21 without in contact with a part in which the fin root 221 is connected to the connection part 21. This is not strictly limited in this embodiment of this disclosure.

In another possible implementation, as shown in FIG. 5, the cooling flow channel 40 extends from the connection part 21 to the fin part 22, and extends between the fin root 221 and the fin top 222. The cooling flow channel 40 can allow the refrigerating medium 30 to flow in the cooling flow channel 40. In other words, the cooling flow channel 40 is located at the connection part 21 and the fin part 22.

It may be understood that, the refrigerating medium 30 is a fluid working medium that can have dual functions of generating gas-liquid phase change and heat conduction, and can implement complete working substance circulation through action of the gas-liquid phase change. However, in this embodiment, the refrigerating medium 30 flows only in the cooling flow channel 40, and therefore the cooling flow channel 40 needs to have a region where complete gas-liquid conversion of the refrigerating medium 30 can occur. That is, the cooling flow channel 40 has a first evaporation region A1 and a condensation region B, and there is a specific height gradient between the first evaporation region A1 and the condensation region B, so that the refrigerating medium 30 can be vaporized when flowing to the first evaporation region A1, and liquefied when flowing to the condensation region B to flow back to the first evaporation region A1. This implements the gas-liquid phase change of the refrigerating medium 30. For example, the first evaporation region A1 is located at the connection part 21 and the fin root 221 of the fin part 22, and the condensation region B is located at the fin top 222 of the fin part 22.

Therefore, heat generated by the heat generation element 200 can be conducted to the first evaporation region A1 in the heat dissipation structure 20 through the substrate 10, the refrigerating medium 30 in the first evaporation region A1 is heated and vaporized in a low vacuum environment, and the gaseous refrigerating medium 30 flows to the condensation region B along the extension direction of the fin part 22 (namely, a direction from the fin root 221 to the fin top 222) under action of a pressure difference. The gaseous refrigerating medium 30 flowing to the condensation region B can be condensed into the liquid refrigerating medium 30, the liquid refrigerating medium 30 is flowed back to the first evaporation region A1 along a direction (namely, a direction from the fin top 222 to the fin root 221) opposite to the foregoing direction under action of gravity, to form complete working substance circulation. This process is repeated in the cooling flow channel 40 to implement continuous heat dissipation for the heat generation element 200.

For example, a solid structure such as a support column may be provided inside the cooling flow channel 40, and when flowing in the cooling flow channel 40, the refrigerating medium 30 avoids the solid structure and flows along a road where the solid structure is not provided. Therefore, a quantity and forms of the support columns affect a flow path form of the cooling flow channel 40, so that a flow path of the cooling flow channel 40 presents diversified layouts. For example, a layout of the flow path of the cooling flow channel 40 may include one or a combination of more of a straight pipe, a U-shaped pipe, a right-angle grid pipe, a diamond grid pipe, a triangular grid pipe, a circular grid pipe, or a honeycomb grid pipe.

A heat dissipation principle of the heat dissipation structure 20 is described above. The following describes a structural possibility of the heat dissipation structure 20 with reference to quantities, connection positions, and connection relationships of the connection parts 21 and the fin parts 22 with reference to FIG. 4, FIG. 5, and FIG. 13 to FIG. 18.

It should be understood that there may be one or more connection parts 21, and there may also be one or more fin parts 22. A quantity of connection parts 21 and the fin parts 22 may be matched based on an actual situation. This is not strictly limited in this embodiment of this disclosure.

In a possible implementation, there is one connection part 21, there is also one fin part 22, and the fin part 22 is bent and connected to the connection part 21.

For example, a cross-sectional shape of the fin part 22 along a height direction of the fin part 22 may be a linear shape, and the height direction of the fin part 22 may be understood as the fin height of the fin part 22, namely, the direction from the fin root 221 to the fin top 222, or the direction from the fin top 222 to the fin root 221, or a direction perpendicular to the substrate 10. That is, the heat dissipation structure 20 is bent once as a whole, to form the L-shaped heat dissipation structure 20 shown in FIG. 13. In this case, the cooling flow channel 40 extends from the connection part 21 to the fin root 221 of the fin part 22, and extends from the fin root 221 of the fin part 22 to the fin top 222 of the fin part 22.

Alternatively, a cross-sectional shape of the fin part 22 along a height direction of the fin part 22 may be an inverted-L shape, and the height direction of the fin part 22 may be understood as the fin height of the fin part 22, namely, the direction from the fin root 221 to the fin top 222, or the direction from the fin top 222 to the fin root 221, or a direction perpendicular to the substrate 10. That is, the heat dissipation structure 20 is bent twice as a whole, to form the Z-shaped heat dissipation structure 20 shown in FIG. 14. In this case, the cooling flow channel 40 extends from the connection part 21 to the fin root 221 of the fin part 22, and extends from the fin root 221 of the fin part 22 to the fin top 222 of the fin part 22.

Alternatively, a cross-sectional shape of the fin part 22 along a height direction of the fin part 22 may be a "⌐" shape, and the height direction of the fin part 22 may be understood as the fin height of the fin part 22, namely, the direction from the fin root 221 to the fin top 222, or the direction from the fin top 222 to the fin root 221, or a direction perpendicular to the substrate 10. That is, the heat dissipation structure 20 is bent three times as a whole, to form the heat dissipation structure 20 in a form shown in FIG. 15. In this case, the cooling flow channel 40 extends from the connection part 21 to the fin root 221 of the fin part 22, extends from the fin root 221 of the fin part 22 to the fin top 222 of the fin part 22, and then extends from the fin top 222 of the fin part 22 to the fin root 221 of the fin part 22.

In another possible implementation, there is one connection part 21, there are two fin parts 22, and fin roots 221 of the two adjacent fin parts 22 are connected by using the connection part 21. It should be understood that when there are a plurality of fin parts 22, cross-sectional shapes of two adjacent fin parts 22 in a height direction of the fin part 22 may be the same or different, that is, structures of two adjacent fin parts 22 may be the same or different. This is not strictly limited in this embodiment.

For example, a cross-sectional shape of one fin part 22 in the height direction of the fin part 22 may be a "⌐" shape, a cross-sectional shape of the other fin part 22 in the height direction of the fin part 22 may be a linear shape, and the height direction of the fin part 22 may be understood as the height of the fin part 22, namely, the direction from the fin root 221 to the fin top 222, or the direction of the fin top 222 to the fin root 221, or a direction perpendicular to the substrate 10. That is, the two adjacent fin parts 22 have different structures, and the heat dissipation structure 20 is bent four times as a whole, to form the S-shaped heat dissipation structure 20 shown in FIG. 16.

Alternatively, a cross-sectional shape of each fin part 22 along a height direction of the fin part 22 may be a linear shape, and the height direction of the fin part 22 may be understood as the fin height of the fin part 22, namely, the direction from the fin root 221 to the fin top 222, or the direction from the fin top 222 to the fin root 221, or a direction perpendicular to the substrate 10. That is, two adjacent fin parts 22 have a same structure, and the heat dissipation structure 20 is bent twice as a whole, to form the U-shaped heat dissipation structure 20 shown in FIG. 17.

In still another possible implementation, there are two connection parts 21, there is one fin part 22, and the two connection parts 21 are separately connected to two sides of the fin root 221 of the fin part 22.

For example, a cross-sectional shape of the fin part 22 along a height direction of the fin part 22 may be a "⌐" shape, and the height direction of the fin part 22 may be understood as the fin height of the fin part 22, namely, the direction from the fin root 221 to the fin top 222, or the direction from the fin top 222 to the fin root 221, or a direction perpendicular to the substrate 10. That is, the heat dissipation structure 20 is bent four times as a whole, to form the heat dissipation structure 20 in a form shown in FIG. 18.

Referring to FIG. 5 again, in still another possible implementation, there are a plurality of (greater than two) connection parts 21, there are a plurality of (two or more) fin parts 22, and the fin roots 221 of two adjacent fin parts 22 are connected by using one connection part 21.

It should be noted that a cross-sectional form of the fin part 22 in a height direction of the fin part 22 in this embodiment is not limited to the forms described in the foregoing several implementations, and may also be one or a combination of more of a linear shape, an L shape, an arc shape, or a serpentine shape. However, when there are the plurality of connection parts 21 and fin parts 22, the entire heat dissipation structure 20 may be in a square wave or wavy form, and may be specifically flexibly adjusted during an actual application. This is not strictly limited in this embodiment.

Based on the foregoing description, it should be understood that there is at least one connection part 21, and at least one fin part 22. When there are a plurality of fin parts 22, structure forms of two adjacent fin parts 22 may be the same or different. This is not strictly limited in this embodiment.

Referring to FIG. 5 again, in this embodiment, a spacing region between two adjacent fin parts 22 forms a first air duct 50. That is, cold air entering the heat sink 100 can continuously flow to an external environment of the heat sink 100 through the first air duct 50 in a flow process. In one aspect, heated air in the first air duct 50 can continuously flow to the external environment of the heat sink 100, and the cold air in the external environment can continuously enter the first air duct 50. This can quickly transfer heat on the heat dissipation structure 20 to the external environment, improve a convection heat exchange level of natural heat dissipation, and increase the condensation area without occupying the large board surface area of the substrate 10, thereby having excellent heat dissipation performance. In another aspect, the double-layer heat dissipation structure 20 of air-cooled heat dissipation and liquid-cooled heat dissipation can be formed by cooperating with the cooling flow channel 40 inside the heat dissipation structure 20. This has diversified performance and wide application range, and can further improve the heat conduction capability of the heat sink 100.

It should be noted that, when the external environment of the fin part 22 is air, a spacing region between two adjacent fin parts 22 can form an air duct for air circulation. When the external environment of the fin part 22 is liquid, a spacing region between two adjacent fin parts 22 can form a liquid channel for liquid circulation. For example, the liquid may be water or oil. An external environment of the fin part 22 is not strictly limited in this embodiment of this disclosure.

Figure 18:
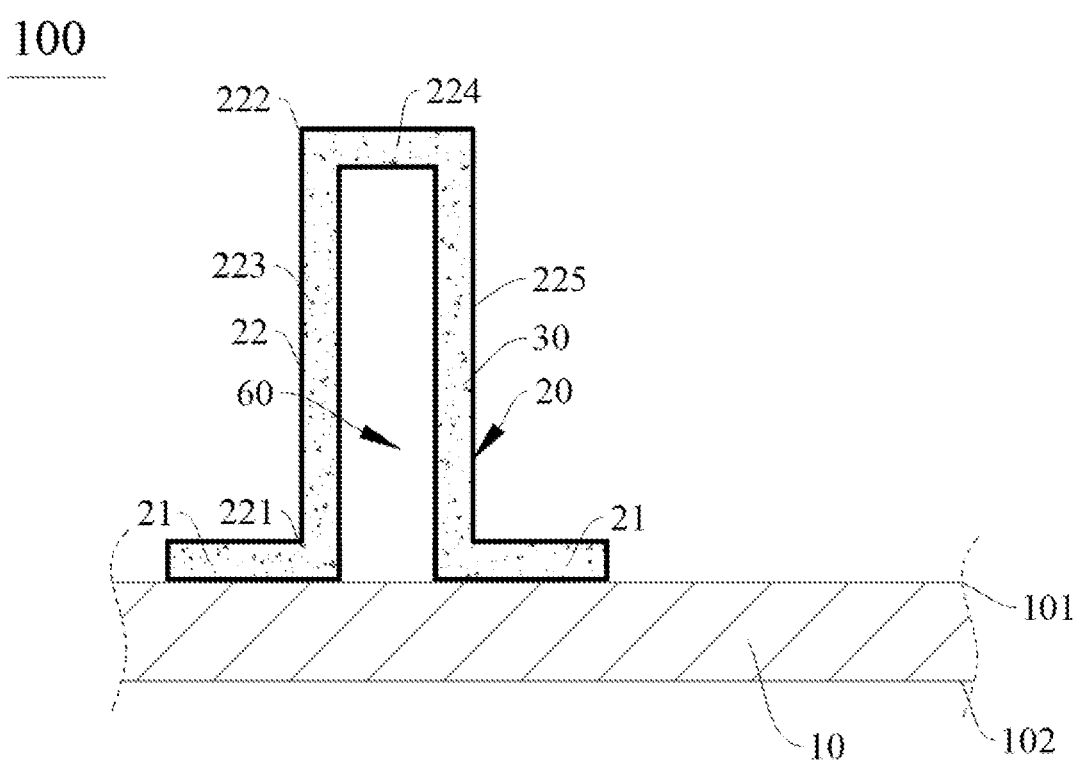
FIG. 18 is a schematic cross-sectional diagram of a third implementation of a heat dissipation structure in a heat sink according to a first embodiment of this disclosure.

Referring to FIG. 5 and FIG. 18, in a possible implementation, the fin part 22 includes a first connection section 223, a second connection section 224, and a third connection section 225. The first connection section 223 and the third connection section 225 are spaced from each other and are respectively connected to two adjacent connection parts 21, both the first connection section 223 and the third connection section 225 are disposed at an included angle with the two adjacent connection parts 21, and the second connection section 224 is connected between an end that is of the first connection section 223 and away from the connection part 21 and an end that is of the third connection section 225 and away from the connection part 21. That is, the first connection section 223 and the second connection section 224, and the second connection section 224 and the third connection section 225 are all bent and connected. A joint of the first connection section 223, the second connection section 224, and the third connection section 225 forms the fin top 222 of the fin part 22, and a joint of the first connection section 223, the third connection section 225, and the two adjacent connection parts 21 forms the fin root 221 of the fin part 22.

Therefore, a cross-sectional shape of the fin part 22 along a height direction of the fin part 22 may be a "⊓" shape, and the height direction of the fin part 22 may be understood as the fin height of the fin part 22, namely, the direction from the fin root 221 to the fin top 222, or the direction from the fin top 222 to the fin root 221, or a direction perpendicular to the substrate 10.

In this setting, a spacing region between the first connection section 223 and the third connection section 225 forms a second air duct 60. That is, cold air entering the heat sink 100 can continuously flow to the external environment of the heat sink 100 through the second air duct 60 in a flow process. In one aspect, heated air in the second air duct 60 can continuously flow to the external environment of the heat sink 100, and the cold air in the external environment can continuously enter the second air duct 60. This can quickly transfer heat on the heat dissipation structure 20 to the external environment, improve a convection heat exchange level of natural heat dissipation, and increase the condensation area without occupying the large board surface area of the substrate 10, thereby having excellent heat dissipation performance. In another aspect, the double-layer heat dissipation structure 20 of air-cooled heat dissipation and liquid-cooled heat dissipation can be formed by cooperating with the cooling flow channel 40 inside the heat dissipation structure 20 and the first air duct 50. This has diversified performance and wide application range, and can further improve the heat conduction capability of the heat sink 100.

It should be noted that, when the external environment of the fin part 22 is air, a spacing region between the first connection section 223 and the third connection section 225 can form an air duct for air circulation. However, when the external environment of the fin part 22 is liquid, a spacing region between the first connection section 223 and the third connection section 225 can form a liquid duct for air circulation. For example, the liquid may be water or oil. An external environment of the fin part 22 is not strictly limited in this embodiment of this disclosure.

It may be understood that, because the first air duct 50 and the second air duct 60 are formed in the heat dissipation structure 20, a ventilation direction of the first air duct 50 is the same as a ventilation direction of the second air duct 60. Descriptions are provided below by using the ventilation direction of the first air duct 50 as an example. These descriptions can all be applied to the ventilation direction of the second air duct 60 without conflict.

Figure 19:
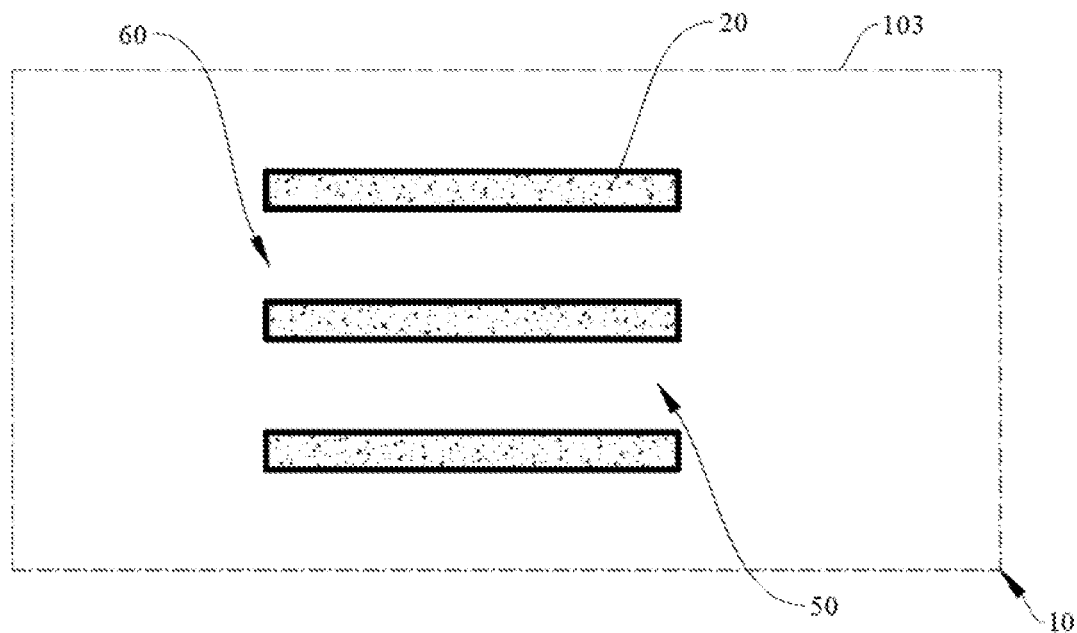
FIG. 19 is a first schematic cross-sectional diagram of an air duct of a heat sink according to a first embodiment of this disclosure.

In a possible implementation, with reference to FIG. 19, the ventilation direction of the first air duct 50 is parallel to an extension direction of a large-plane side wall 103, where the large-plane side wall 103 is a side wall 103 with a largest area in the four side walls 103 of the substrate 10. That is, a placement direction of the heat dissipation structure 20 is parallel to the extension direction of the large-plane side wall 103. FIG. 19 is a schematic diagram of a structure obtained by cutting at a middle position of the fin height and with a reference plane C in parallel to the substrate 10.

Figure 20:
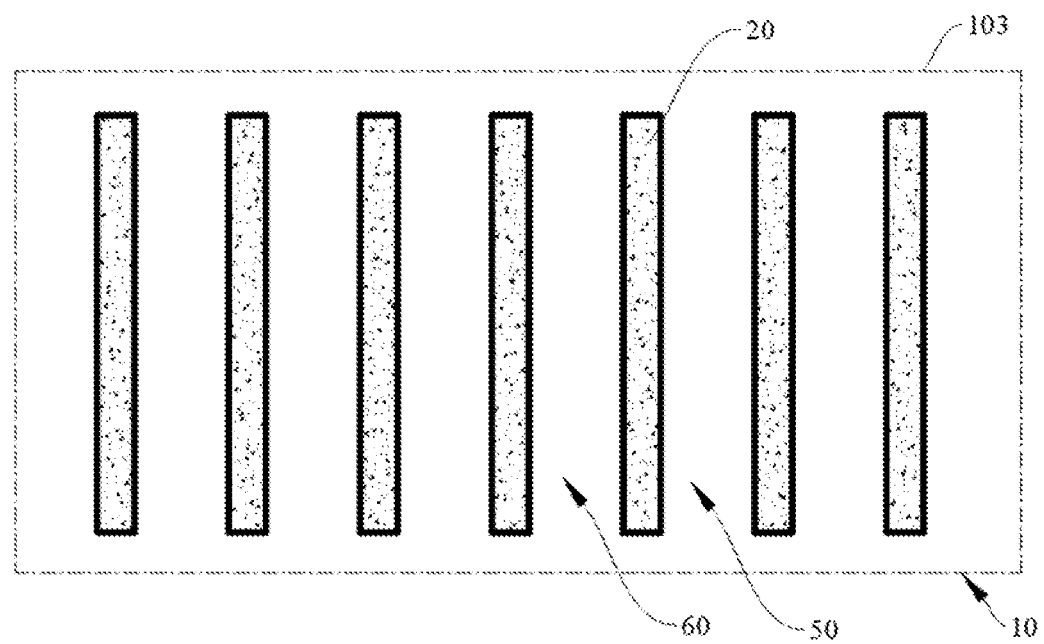
FIG. 20 is a second schematic cross-sectional diagram of an air duct of a heat sink according to a first embodiment of this disclosure.
Figure 21:
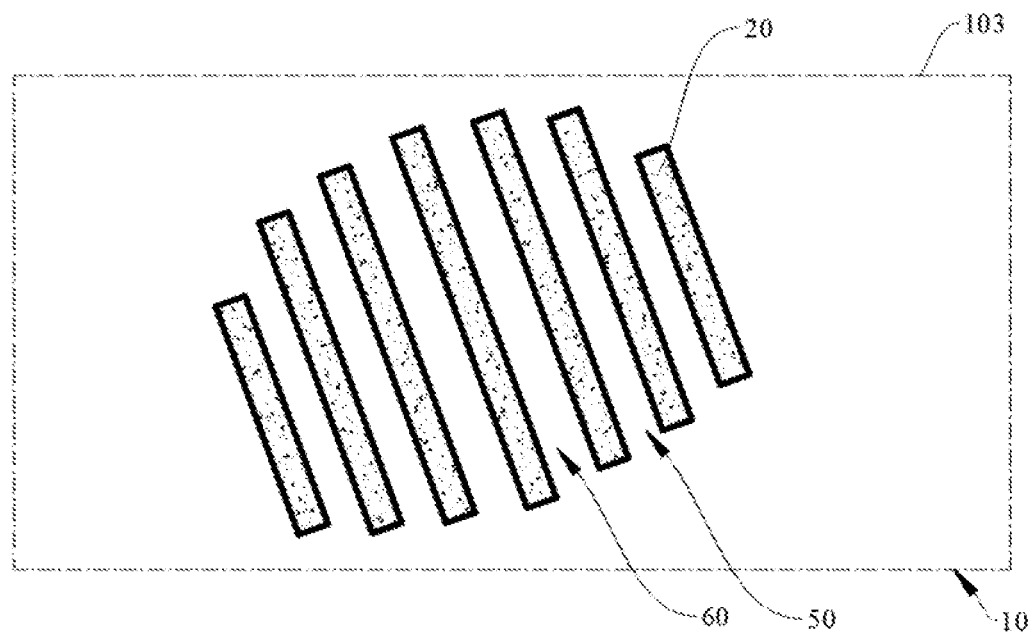
FIG. 21 is a third schematic cross-sectional diagram of an air duct of a heat sink according to a first embodiment of this disclosure.

In another possible implementation, reference to FIG. 20, ventilation direction of the first air duct 50 is perpendicular to an extension direction of a large-plane side wall 103, where the large-plane side wall 103 is a side wall 103 with a largest area in the four side walls 103 of the substrate 10. That is, a placement direction of the heat dissipation structure 20 is perpendicular to the extension direction of the large-plane side wall 103. FIG. 20 is a schematic diagram of a structure obtained by cutting at a middle position of the fin height and with a reference plane C that is in parallel to the substrate 10.

In still another possible implementation, with reference to FIG. 21, FIG. 22, FIG. 23, and FIG. 24, the ventilation direction of the first air duct 50 intersects (excluding vertical) an extension direction of a large-plane side wall 103, where the large-plane side wall 103 is a side wall 103 with a largest area in the four side walls 103 of the substrate 10. That is, a placement direction of the heat dissipation structure 20 intersects the extension direction of the large-plane side wall 103. FIG. 21 to FIG. 24 each is a schematic diagram of a structure obtained by cutting at a middle position of the fin height and with a reference plane C that is in parallel to the substrate 10.

Therefore, heat at a bottom of the first air duct 50 is inclined to rise along with the direction of the first air duct 50, so that hot air can flow from bottom to top along a specific angle based on a floating force, and cold air can flow from bottom to top along a specific angle based on a floating force. This quickly removes heat of the heat dissipation structure 20. The floating force does not easily affect temperatures of a lower region of the air duct and an upper region of the air duct, can reduce influence of a top-and-bottom heat serial connection caused by the heat dissipation structure 20, improve convection heat exchange performance of the heat dissipation structure 20, and effectively improve condensation heat exchange of the refrigerating medium 30 inside the heat dissipation structure 20.

For example, there is one heat dissipation structure 20, and the heat dissipation structure 20 is disposed on the substrate 10 obliquely. Therefore, an oblique layout shown in FIG. 21 can be formed.

Alternatively, there are two heat dissipation structures 20, the two heat dissipation structures 20 are obliquely and symmetrically disposed on the substrate 10, the two adjacent heat dissipation structures 20 are spaced from each other, and a spacing region between the two adjacent heat dissipation structures 20 can form a third air duct 70 communicating with the first air duct 50 and the second air duct 60.

Figure 22:
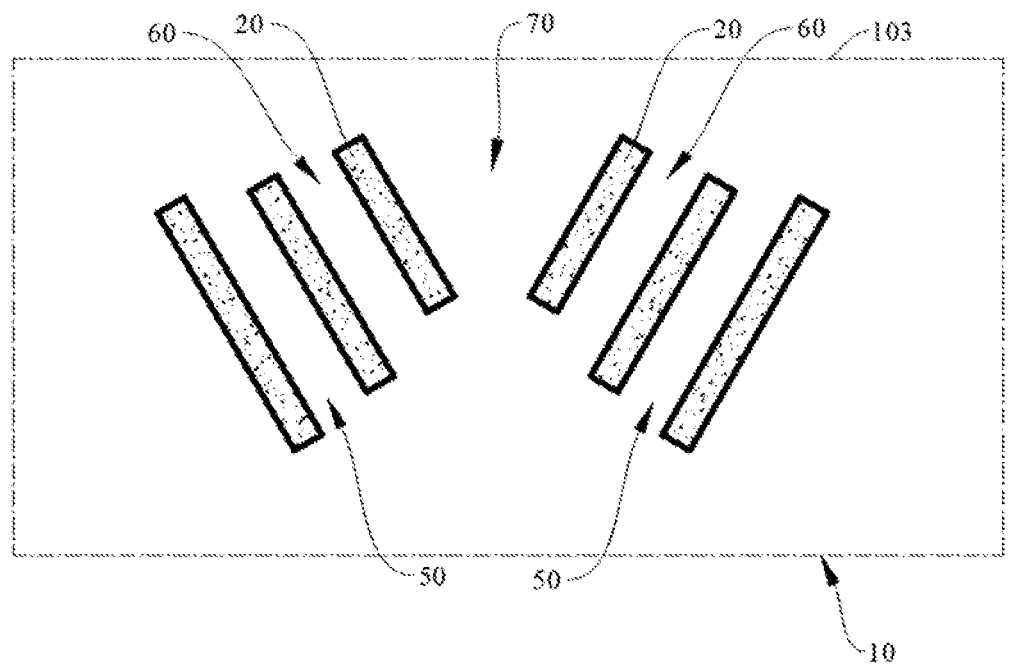
FIG. 22 is a fourth schematic cross-sectional diagram of an air duct of a heat sink according to a first embodiment of this disclosure.
Figure 23:
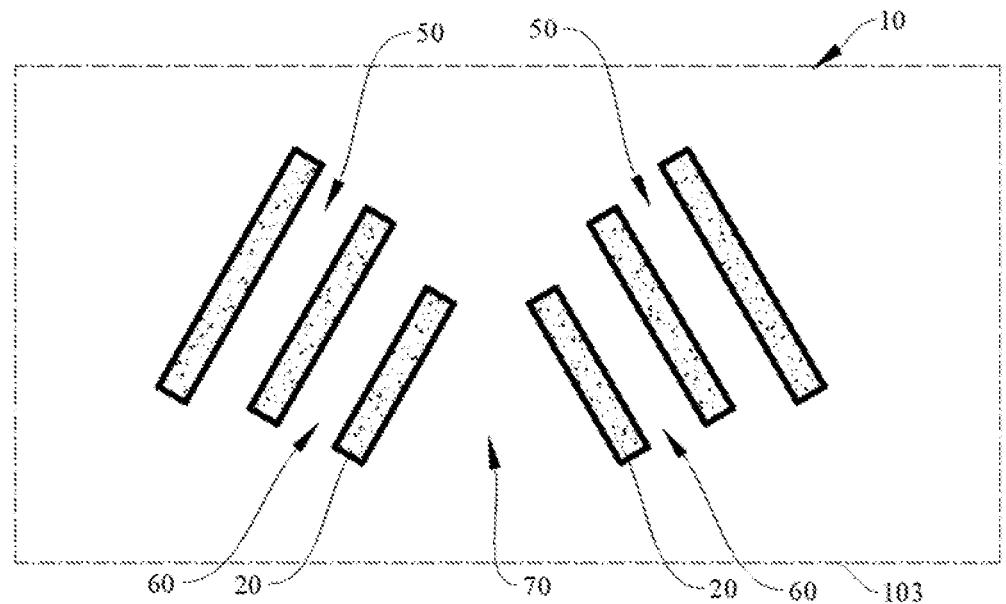
FIG. 23 is a fifth schematic cross-sectional diagram of an air duct of a heat sink according to a first embodiment of this disclosure.

Therefore, a V-shaped layout shown in FIG. 22 may be formed, or an "人"-shaped layout shown in FIG. 23 may be formed. In this way, in a process in which cold air entering the heat sink 100 flows in the third air duct 70, the cold air enters the first air duct 50 and the second air duct 60 on both sides of the third air duct 70, flows in the first air duct 50 and the second air duct 60 on the sides, and takes away heat of the two heat dissipation structures 20 separately, so as to improve heat dissipation effect of the communication device 1000.

Alternatively, there are four heat dissipation structures 20, each two adjacent heat dissipation structures 20 are obliquely and symmetrically disposed on the substrate 10, the two adjacent heat dissipation structures 20 are spaced from each other, and a spacing region between the two adjacent heat dissipation structures 20 can form a third air duct 70 communicating with the first air duct 50 and the second air duct 60.

Figure 24:
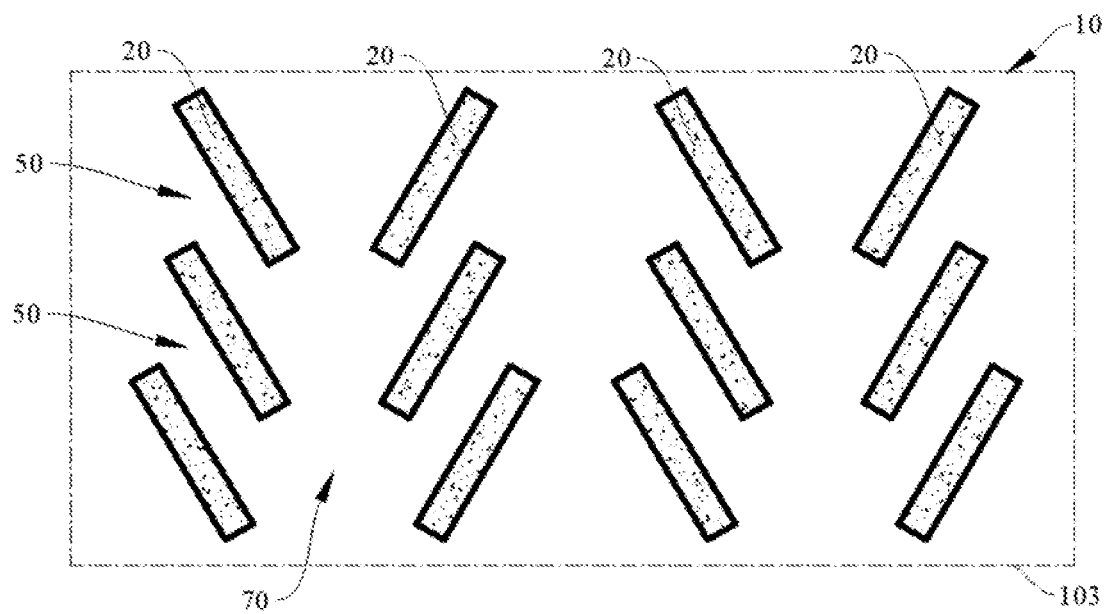
FIG. 24 is a sixth schematic cross-sectional diagram of an air duct of a heat sink according to a first embodiment of this disclosure.

Therefore, a W-shaped layout as shown in FIG. 24 can be formed. In this way, in a process in which cold air entering the heat sink 100 flows in the third air duct 70, the cold air enters the first air duct 50 and the second air duct 60 on both sides of the third air duct 70, flows in the first air duct 50 and the second air duct 60 on the sides, and takes away heat of the two heat dissipation structures 20 separately, so as to improve heat dissipation effect of the communication device 1000.

Based on the foregoing description, it should be understood that there may be one or more heat dissipation structures 20. Therefore, a quantity of heat dissipation structures 20 is adjusted, to implement diversified fin sheet layouts, and further implement, by fully utilizing the fin sheet layouts, low thermal resistance, uniform temperature heat conduction, and better convection heat exchange performance of the fin sheet.

Figure 25:
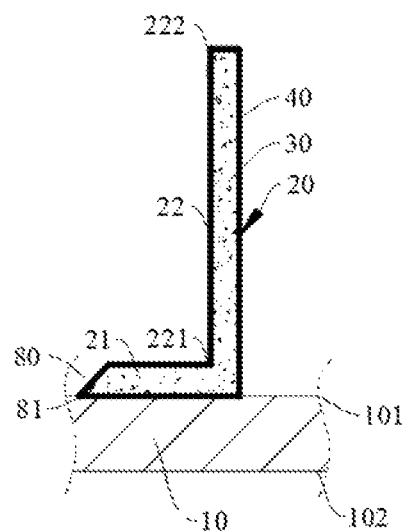
FIG. 25 is a schematic cross-sectional diagram of a reinforcement structure of a heat sink according to a first embodiment of this disclosure.
Figure 26:
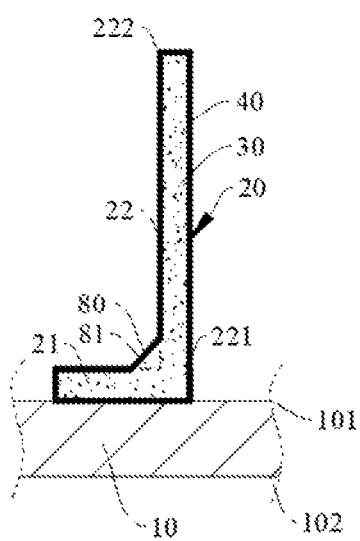
FIG. 26 is another schematic cross-sectional diagram of a reinforcement structure of a heat sink according to a first embodiment of this disclosure.
Figure 27:
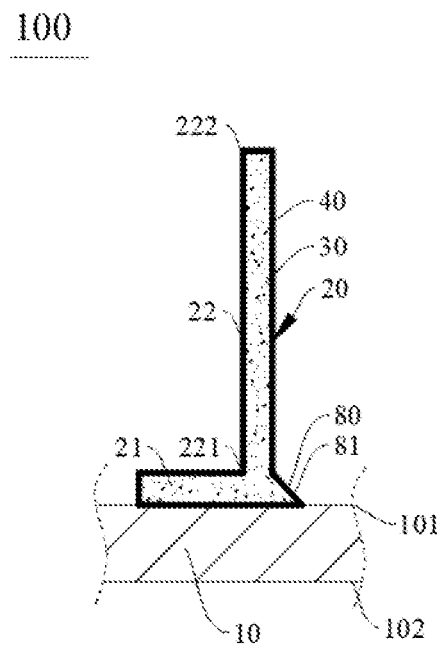
FIG. 27 is still another schematic cross-sectional diagram of a reinforcement structure of a heat sink according to a first embodiment of this disclosure.

Referring to FIG. 25, FIG. 26, and FIG. 27, in this embodiment, the heat sink 100 may further include a reinforcement structure 80, and the reinforcement structure 80 is disposed on the heat dissipation structure 20 or connected between the heat dissipation structure 20 and the substrate 10. Therefore, secondary processing is performed on the heat dissipation structure 20, so that an overall heat exchange area of the heat sink 100 can be effectively increased, and overall strength of the heat sink 100 can be improved. For example, a connection form between the reinforcement structure 80 and the heat dissipation structure 20 and the substrate 10 may be but is not limited to welding, bonding, or through-hole expansion.

In a possible implementation, the reinforcement structure 80 is disposed between the connection part 21 and the substrate 10. For example, the reinforcement structure 80 may be disposed at a position shown in FIG. 25.

In another possible implementation, the reinforcement structure 80 is disposed between the connection part 21 and the fin part 22. For example, the reinforcement structure 80 may be disposed at a position shown in FIG. 26.

In still another possible implementation, the reinforcement structure 80 is disposed between the fin part 22 and the substrate 10. For example, the reinforcement structure 80 may be disposed at a position shown in FIG. 27.

The reinforcement structure 80 may be provided with a through-flow channel 81 communicating with the cooling flow channel 40. For example, the reinforcement structure 80 may be of the same material as the heat dissipation structure 20. In one aspect, structural rigidity of the heat sink 100 is improved, so that the entire heat sink 100 can have excellent structural reliability and stability. In another aspect, the heat dissipation area of the heat sink 100 can be increased, condensation effect of the refrigerating medium 30 can be improved, and flow-back of the refrigerating medium 30 can be promoted.

Figure 28:
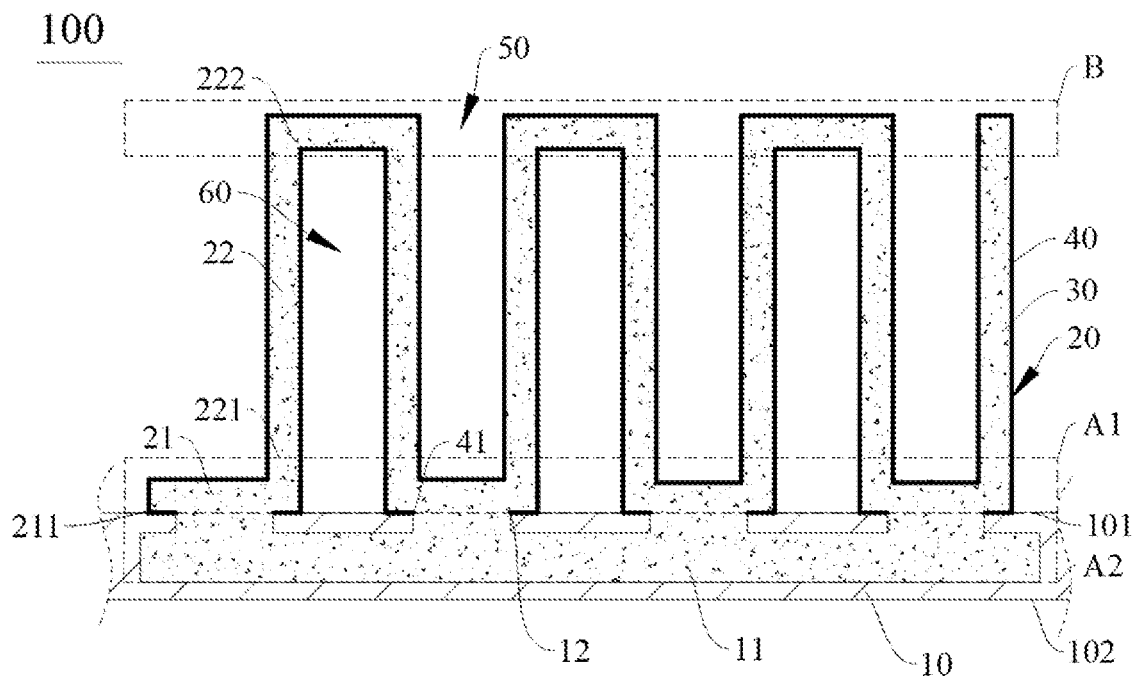
FIG. 28 is a schematic cross-sectional diagram of a heat sink according to a second embodiment of this disclosure.

Referring to FIG. 28, in a second embodiment of this disclosure, a structure of the heat sink 100 in the first embodiment is applied to a structure of the heat sink 100 without conflict in the second embodiment described below. In this embodiment, content that is the same as that in the first embodiment is not described again. Different from that in the first embodiment, the substrate 10 is of a hollow structure.

A cavity 11 is disposed in the substrate 10, so that the entire substrate 10 is disposed in the hollow structure. The cavity 11 is communicated with the cooling flow channel 40, so that the refrigerating medium 30 flows in the cavity 11 and the cooling flow channel 40. In other words, in this embodiment, the refrigerating medium 30 flows in the cavity 11 and the cooling flow channel 40. This can minimize a heat conduction temperature difference of the entire heat sink 100, and improve heat transfer efficiency of the entire heat sink 100.

It may be understood that, the refrigerating medium 30 is a fluid working medium that can have dual functions of generating gas-liquid phase change and heat conduction, and can implement complete working substance circulation through action of the gas-liquid phase change. However, in this embodiment, the refrigerating medium 30 flows in the cavity 11 and the cooling flow channel 40, and therefore the cavity 11 and the cooling flow channel 40 need to have a region where gas-liquid conversion of the refrigerating medium 30 can occur.

Specifically, the cavity 11 is a second evaporation region A2, that is, the entire cavity 11 constitutes the second evaporation region A2 in the substrate 10, so that the refrigerating medium 30 is vaporized in the second evaporation region A2. The cooling flow channel 40 has the first evaporation region A1 and the condensation region B, and there is the specific height gradient between the first evaporation region A1 and the condensation region B, so that the refrigerating medium 30 can be vaporized when flowing to the first evaporation region A1, and liquefied when flowing to the condensation region B to flow back to the first evaporation region A1 and the second evaporation region A2. This implements the gas-liquid phase change of the refrigerating medium 30. For example, the condensation region B is located at the connection part 21 and the fin root 221 of the fin part 22, and the first evaporation region A1 is located at the fin top 222 of the fin part 22.

Referring to FIG. 28, in this embodiment, the cooling flow channel 40 has a first through-flow structure 41, the first through-flow structure 41 is disposed on the contact surface 211, and the first through-flow structure 41 may be understood as an outlet of the cooling flow channel 40. The cavity 11 has a second through-flow structure 12, the second through-flow structure 12 is disposed on the second surface 102, and the second through-flow structure 12 may be understood as an outlet of the cavity 11. The second through-flow structure 12 is communicated with at least a part of the first through-flow structure 41. In this setting, a heat transfer path of the refrigerating medium 30 is short and flow resistance is small, and a large temperature difference generated locally in the heat sink 100 can be avoided to the greatest extent.

It should be noted that, descriptions are provided below by using a form in which only one connection part 21 is communicated with the substrate 10. However, without conflict, the descriptions may also be applicable to another form in which the connection part 21 is communicated with the substrate 10. That is, when the heat dissipation structure 20 has a plurality of connection parts 21, there may be a plurality of first through-flow structures 41. Accordingly, the cavity 11 may also have a plurality of second through-flow structures 12 corresponding to the plurality of first through-flow structures 41. The plurality of second through-flow structures 12 may be spaced from each other at positions on the substrate 10, and spacings between the plurality of second through-flow structures 12 may be equal or different.

Therefore, when the heat sink 100 is vertically disposed, heat dissipation difficulty when there are a plurality of heat dissipation members disposed at positions on the second surface 102 of the substrate 10, namely, heat dissipation difficulty when a plurality of heat sources are disposed, can be effectively reduced. In this way, when a liquid level of the refrigerating medium 30 filled in the cavity 11 is low, the refrigerating medium 30 can absorb heat of a heat source at the bottom, and heat at the middle and top can enter the cooling flow channel 40 through the first through-flow structure 41 and the second through-flow structure 12 at corresponding positions, so that the heat dissipation structure 20 also participates in heat dissipation. When a liquid level of the refrigerating medium 30 filled in the cavity 11 is medium, the refrigerating medium 30 can absorb heat of heat sources at the bottom and middle, and heat at the top can enter the cooling flow channel 40 through the first through-flow structure 41 and the second through-flow structure 12 at corresponding positions, so that the heat dissipation structure 20 also participates in heat dissipation.

Based on the foregoing description, the technical solutions provided in embodiments can quickly perform effective heat exchange and cooling in a risk region in the substrate 10 that is prone to overheating, and minimize a possibility that the heat sink 100 fails due to overheating, so that the heat sink 100 is not damaged due to local overtemperature, and has high reliability.

In a possible implementation, the second through-flow structure 12 is communicated with a part of the first through-flow structure 41. Therefore, the refrigerating medium 30 in the cavity 11 can flow smoothly into the cooling flow channel 40 with fluidity. In addition, an outlet of the cooling flow channel 40 does not need to be totally in communication with an outlet of the cavity 11, so that a processing and manufacturing process of the heat sink 100 can be simpler.

In another possible implementation, the second through-flow structure 12 is communicated with all of the first through-flow structure 41.

Based on the foregoing description, it should be understood that a flow volume and a flow speed of the refrigerating medium 30 can be controlled by changing a degree of communication between the second through-flow structure 12 and the first through-flow structure 41, to ensure flow reliability and uniformity of the refrigerating medium 30 in the substrate 10 and the heat dissipation structure 20.

For example, a shape of the first through-flow structure 41 can be adapted to a shape of the second through-flow structure 12, so that a processing and manufacturing process of the heat sink 100 can be simpler, and time and production costs of the heat sink 100 are reduced. For example, the first through-flow structure 41 is a groove-like structure, and the second through-flow structure 12 is also a groove-like structure: or the first through-flow structure 41 is a hole-like structure, and the second through-flow structure 12 is also a hole-like structure. Certainly, it should be understood that a shape of the first through-flow structure 41 may not be adapted to a shape of the second through-flow structure 12, provided that the second through-flow structure 12 is communicated with at least a part of the first through-flow structure 41. This is not strictly limited in this embodiment.

In this way, the cavity 11 and the cooling flow channel 40 can pass through each other due to communication between the first through-flow structure 41 and the second through-flow structure 12, and the refrigerating medium 30 can flow in the cavity 11 and the heat dissipation structure 20, thereby effectively improving temperature equalization performance of the heat sink 100, and further improving the overall heat dissipation capability of the heat sink 100.

Figure 29:
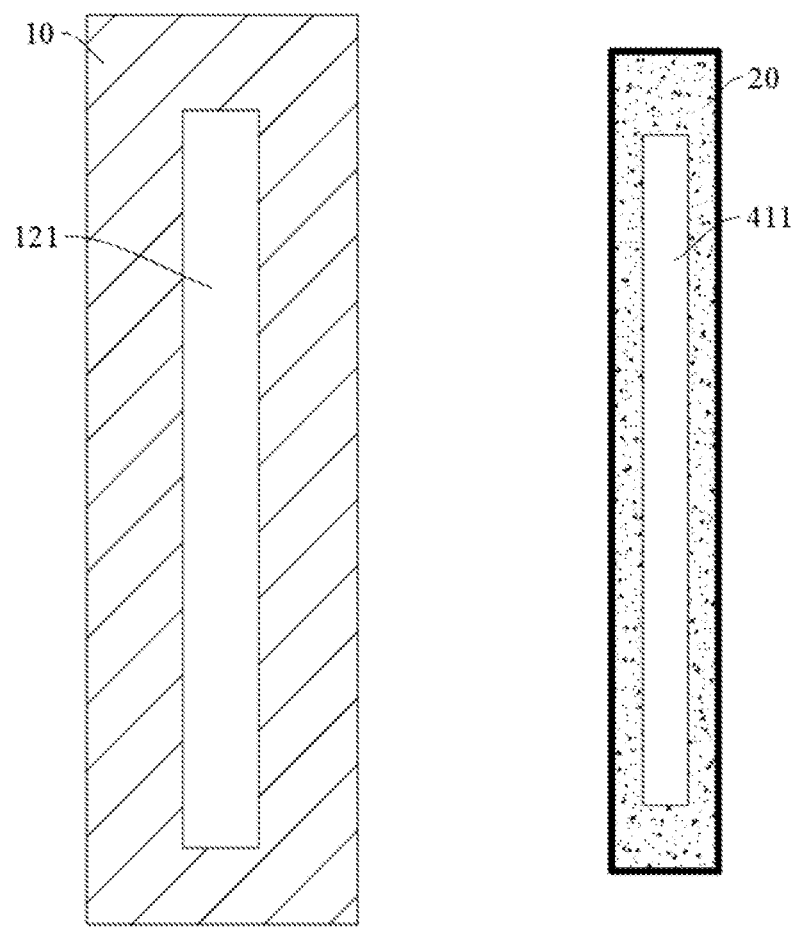
FIG. 29 is a first schematic cross-sectional diagram of a correspondence between a first through-flow substructure and a second through-flow substructure of a heat sink according to a second embodiment of this disclosure.

Referring to FIG. 29, in a possible implementation, the first through-flow structure 41 includes one first through-flow substructure 411, the second through-flow structure 12 includes one second through-flow substructure 121, and the first through-flow substructure 411 and the second through-flow substructure 121 are connected in a one-to-one manner. In other words, the first through-flow structure 41 and the second through-flow structure 12 can form a one-to-one mating relationship.

For example, a shape of the first through-flow substructure 411 can be adapted to a shape of the second through-flow substructure 121, so that a processing and manufacturing process of the heat sink 100 can be simpler, and time and production costs of the heat sink 100 are reduced. For example, the first through-flow substructure 411 is a groove-like structure, and the second through-flow substructure 121 is also a groove-like structure: or the first through-flow substructure 411 is a hole-like structure, and the second through-flow substructure 121 is also a hole-like structure. Certainly, it should be understood that a shape of the first through-flow substructure 411 may not be adapted to a shape of the second through-flow substructure 121, provided that the second through-flow substructure 121 is communicated with the first through-flow substructure 411. This is not strictly limited in this embodiment.

Figure 30:
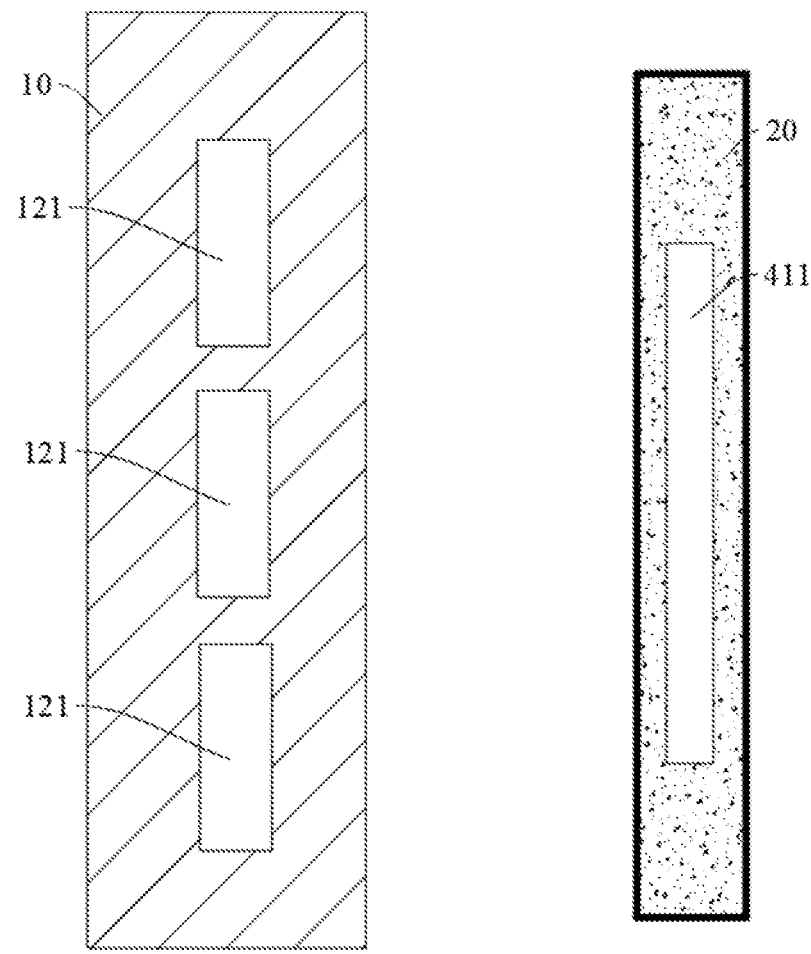
FIG. 30 is a second schematic cross-sectional diagram of a correspondence between a first through-flow substructure and a second through-flow substructure of a heat sink according to a second embodiment of this disclosure.

Referring to FIG. 30, another possible implementation, different from that in the first implementation, the first through-flow structure 41 includes one first through-flow substructure 411, the second through-flow structure 12 includes a plurality of second through-flow substructures 121 spaced from each other, and each second through-flow substructure 121 is connected to the first through-flow substructure 411. In other words, the first through-flow substructure 411 and the second through-flow substructure 121 can form a one-to-many matching relationship.

Therefore, the plurality of second through-flow substructures 121 are intermittently designed, so that a specific layout limitation of a component and a structure member in the substrate 10 can be fully considered. For example, a spacing region between adjacent second through-flow substructures 121 can effectively avoid a structure support column, or a solid column for mounting a screw, disposed in the cavity 11, a layout is reasonable, and practicability is strong.

Figure 31:
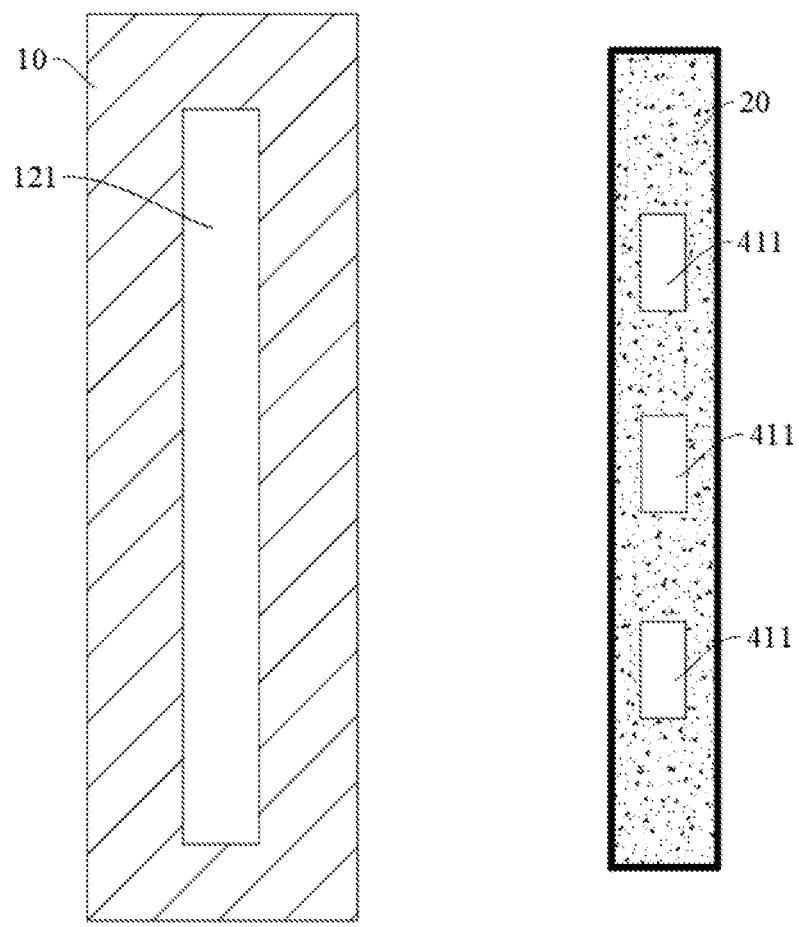
FIG. 31 is a third schematic cross-sectional diagram of a correspondence between a first through-flow substructure and a second through-flow substructure of a heat sink according to a second embodiment of this disclosure.

Referring to FIG. 31, in still another possible implementation, different from that in the first implementation, the first through-flow structure 41 includes a plurality of first through-flow substructures 411 spaced from each other, the second through-flow structure 12 includes one through-flow substructure, and each first through-flow substructure 411 is connected to the second through-flow substructure 121. In other words, the first through-flow substructure 411 and the second through-flow substructure 121 can form a one-to-many matching relationship.

Therefore, the plurality of first through-flow substructures 411 are intermittently designed, so that a problem that there is a risk of damage in an actual use process if a size of the outlet of the cooling flow channel 40 is excessively large can be fully considered, and safety and reliability are good.

Figure 32:
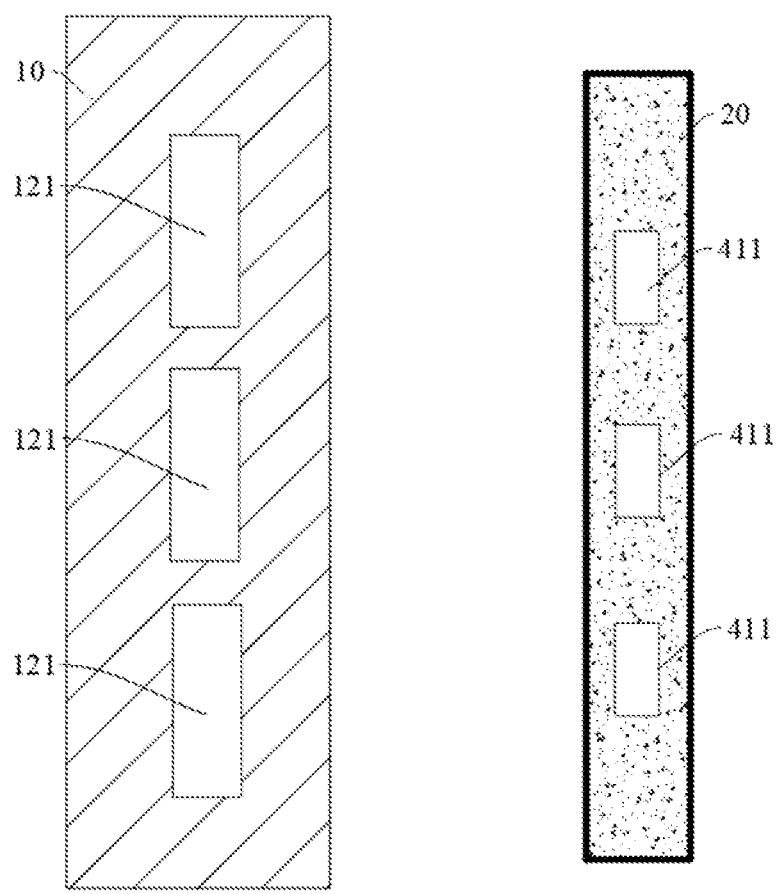
FIG. 32 is a fourth schematic cross-sectional diagram of a correspondence between a first through-flow substructure and a second through-flow substructure of a heat sink according to a second embodiment of this disclosure.
Figure 33:
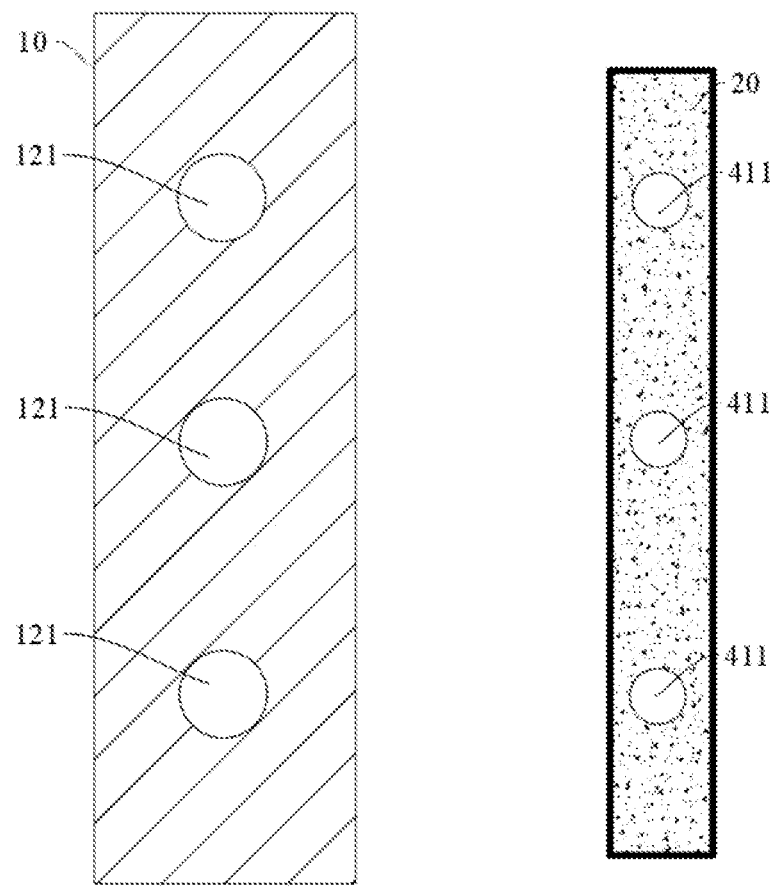
FIG. 33 is a fifth schematic cross-sectional diagram of a correspondence between a first through-flow substructure and a second through-flow substructure of a heat sink according to a second embodiment of this disclosure.

With reference to FIG. 32 and FIG. 33, in yet another possible implementation, different from that in the first implementation, the first through-flow structure 41 includes a plurality of first through-flow substructures 411 spaced from each other, the second through-flow structure 12 includes a plurality of second through-flow substructures 121 spaced from each other, and the plurality of first through-flow substructures 411 and the plurality of second through-flow substructures 121 are connected to in a one-to-one manner. In other words, the first through-flow structure 41 and the second through-flow structure 12 can form a one-to-one mating relationship.

Based on the foregoing description, it should be understood that connection positions and connection possibilities of the first through-flow structure 41 and the second through-flow structure 12 are related to resistance of the refrigerating medium 30 when the refrigerating medium 30 is evaporated into a gaseous state and returns to liquid. This ensures that flow resistance does not affect liquid return performance, provides a variety of layouts, and can increase possibilities of implementing vapor phase conversion of the refrigerating medium 30.

Figure 34:
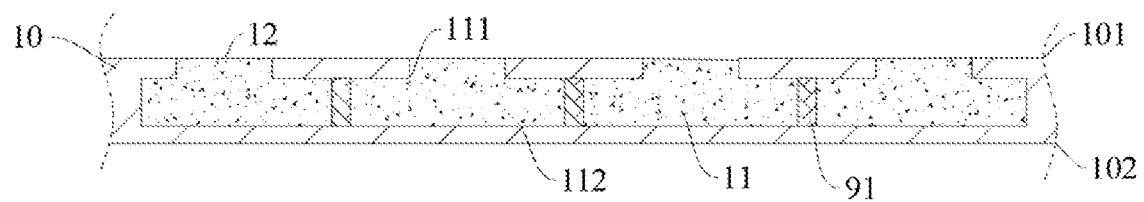
FIG. 34 is a schematic cross-sectional diagram of a substrate in a heat sink according to a second embodiment of this disclosure.

Referring to FIG. 34, in this embodiment, the cavity 11 includes a top wall 111 and a bottom wall 112 that are oppositely disposed along a height direction of the substrate 10. The bottom wall 112 is disposed on a same side as the first surface 101, the bottom wall 112 is disposed on a same side as the second surface 102, and the top wall 111 is closer to the heat dissipation structure 20 than the bottom wall 112.

It may be understood that, because the cavity 11 is the second evaporation area A2, to ensure vaporization reliability of the refrigerating medium 30, a structure that can enhance evaporation and vaporization of the refrigerating medium 30 may be disposed in the cavity 11, which is specifically described in detail with reference to the following several implementations.

In a possible implementation, as shown in FIG. 34, the heat sink 100 further includes a support structure 91, and the support structure 91 is located in the cavity 11. For example, the support structure 91 is supported between the top wall 111 and the bottom wall 112; or one end of two ends of the support structure 91 is pressed against one of the top wall 111 and the bottom wall 112, and the other end is isolated (spaced) from the other of the top wall 111 and the bottom wall 112. There may be one or more support structures 91. When there are a plurality of support structures 91, the plurality of support structures 91 are spaced from each other.

That is, the support structure 91 can be fastened to the top wall 111 or the bottom wall 112, or both the top wall 111 and the bottom wall 112. Therefore, a connection between the support structure 91 and the top wall 111 and the bottom wall 112 can be designed based on reliability and stress distribution of a support position to be supported. For example, the support structure 91 may be fastened to the top wall 111 and/or the bottom wall 112 by welding or gluing. Alternatively, the support structure 91 may also be integrally formed with an inner cavity of a housing, so that not only the support structure 91 is firmly connected to a wall surface of the cavity 11, but also a process of the heat sink 100 is simplified.

In addition, a groove (not shown in the figure) is disposed on an outer surface of the support structure 91. The groove can accelerate a process of converting the liquid refrigerating medium 30 into the gaseous state, thereby enhancing boiling.

Therefore, in one aspect, the support structure 91 can maintain a shape of the substrate 10. This minimizes a possibility of affecting flow-back when a longitudinal spacing between the top wall 111 and the bottom wall 112 is shortened because the substrate 10 is deformed under action of an external force. In another aspect, the support structure 91 can shorten time required for converting the liquid refrigerating medium 30 into the gaseous refrigerating medium 30, thereby strengthening boiling and accelerating flow-back.

Figure 35:
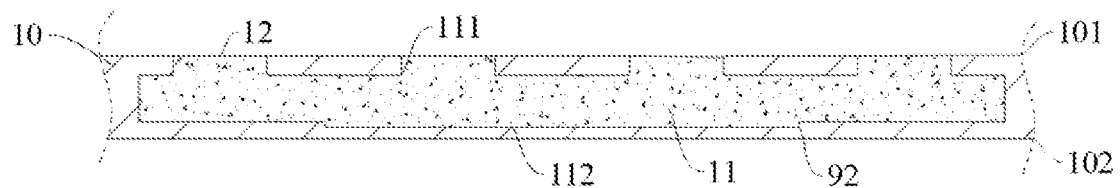
FIG. 35 is another schematic cross-sectional diagram of a substrate in a heat sink according to a second embodiment of this disclosure.

Referring to FIG. 35, in another possible implementation, a groove 92 may be disposed on the bottom wall 112 of the heat sink 100. Therefore, the groove 92 is disposed in the cavity 11 near a wall surface of the heat generation element 200, to accelerate the process of converting the liquid refrigerating medium 30 into the gas refrigerating medium, and greatly shorten the time required for vaporization of the refrigerating medium 30, thereby strengthening evaporation of the refrigerating medium 30.

Figure 36:
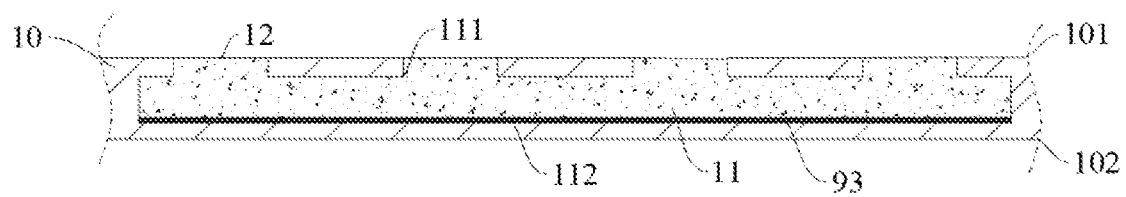
FIG. 36 is still another schematic cross-sectional diagram of a substrate in a heat sink according to a second embodiment of this disclosure.

Referring to FIG. 36, in still another possible implementation, the heat sink 100 further includes a first capillary structure 93, and the first capillary structure 93 is located in the cavity 11 and is connected to the bottom wall 112. For example, the first capillary structure 93 may be a tow, a silk mesh, grog, or a fiber.

Therefore, in one aspect, it is beneficial for the condensed refrigerating medium 30 to flow back from a cooling region to the second evaporation region A2, thereby avoiding a problem that the heat generated by the heat generation element 200 cannot be dissipated in time due to a small quantity of liquid refrigerating media 30 in the second evaporation region A2, and improving heat dissipation performance of the heat dissipation member. In another aspect, this can accelerate the process of converting the liquid refrigerating medium 30 into the gaseous refrigerating medium, and greatly shorten the time required for vaporization of the refrigerating medium 30, thereby strengthening evaporation and vaporization of the refrigerating medium 30.

Figure 37:
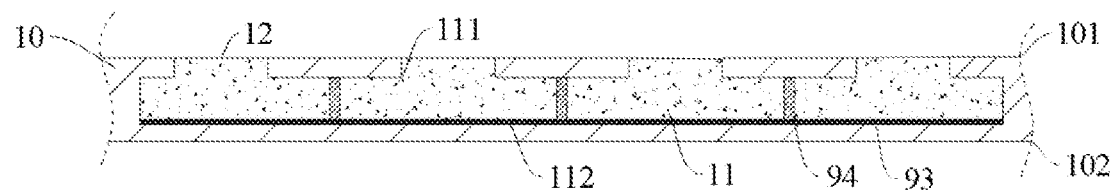
FIG. 37 is yet another schematic cross-sectional diagram of a substrate in a heat sink according to a second embodiment of this disclosure.

Referring to FIG. 37, in yet another possible implementation, the heat sink 100 further includes a first capillary structure 93 and a second capillary structure 94, and the first capillary structure 93 is located in the cavity 11 and is connected to the bottom wall 112. The second capillary structure 94 is located in the cavity 11, one end of the second capillary structure 94 is connected to the first capillary structure 93, and the other end of the second capillary structure 94 is connected to the top wall 111. For example, the first capillary structure 93 and the second capillary structure 94 each may be a tow, a silk mesh, grog, or a fiber.

Therefore, in one aspect, it is beneficial for the condensed refrigerating medium 30 to flow back from a cooling region to the second evaporation region A2, thereby avoiding a problem that the heat generated by the heat generation element 200 cannot be dissipated in time due to a small quantity of liquid refrigerating media 30 in the second evaporation region A2, and improving heat dissipation performance of the heat dissipation member. In another aspect, this can accelerate the process of converting the liquid refrigerating medium 30 into the gaseous refrigerating medium, and greatly shorten the time required for vaporization of the refrigerating medium 30, thereby strengthening evaporation and vaporization of the refrigerating medium 30.

The foregoing describes embodiments of this disclosure in detail. The principle and implementations of this disclosure are described herein by using specific examples. The description about the above embodiments is merely provided to help understand the method and core ideas of this disclosure. In addition, a person of ordinary skill in the art can make variations and modifications to this disclosure in terms of the specific implementations and application scopes according to the ideas of this disclosure. Therefore, the content of specification shall not be construed as a limit to this disclosure.

What is claimed is:

1. A heat sink comprising:
a substrate;
a heat dissipation structure comprising a connection part and a fin part that are of an integrated structure, wherein the connection part is connected to the substrate, the fin part and the connection part are disposed at an included angle, a fin root of the fin part is connected to the connection part, a fin top of the fin part is away from the connection part, a cooling flow channel is disposed in the heat dissipation structure, and at least a part of the cooling flow channel is located in the fin part; and
a refrigerating medium configured to flow in the cooling flow channel to dissipate heat from the substrate;
wherein,
a cavity is disposed in the substrate, and the cavity is in communication with the cooling flow channel, so that the refrigerating medium is configured to flow in the cavity and the cooling flow channel;
the connection part comprises a contact surface, the substrate comprises a first surface, and the contact surface is disposed opposite to the first surface;
the cooling flow channel has a first through-flow structure, the first through-flow structure is disposed on the contact surface, the cavity has a second through, flow structure, and the second through-flow structure is disposed on the first surface; and
the second through-flow structure is in communication with at least a part of the first through-flow structure; and
wherein:
the first through-flow structure comprises one or more first through-flow substructures spaced from each other, the second through-flow structure comprises second through-flow substructures whose quantity is the same as that of the first through-flow substructures, and the first through-flow substructures and the second through-flow substructures are in communication in a one-to-one manner; or
the first through-flow structure comprises a plurality of first through-flow substructures spaced from each other, the second through-flow structure comprises one second through-flow substructure, and each of the first through-flow substructures is in communication with the second through-flow substructure, or
the first through-flow structure comprises one first through-flow structure, the second through-flow structure comprises a plurality of second through-flow substructures spaced from each other, and each of the second through-flow substructures is in communication with the first through-flow substructure.

2. The heat sink according to claim 1, wherein:
the cooling flow channel extends from the connection part to the fin part and extends between the fin root and the fin top; or
the cooling flow channel is located in the fin part but not the connection part, and extends between the fin root and the fin top.

3. The heat sink according to claim 1, wherein the substrate and the heat dissipation structure are of an integrated structure.

4. The heat sink according to claim 1, wherein the heat dissipation structure comprises a plurality of connection parts and a plurality of fin parts, fin roots of two adjacent fin parts are connected through one connection part, and a spacing region between the two adjacent fin parts forms an air duct.

5. The heat sink according to claim 1, wherein the fin part comprises a first connection section, a second connection section, and a third connection section;
the first connection section and the third connection section are spaced from each other and are respectively connected to two adjacent connection parts, both the first connection section and the third connection section are disposed at an included angle with the two adjacent connection parts, and the second connection section is connected between an end that is of the first connection section and away from the connection part and an end that is of the third connection section and away from the connection part;
a joint of the first connection section, the second connection section, and the third connection section forms the fin top of the fin part, and a joint of the first connection section, the third connection section, and the two adjacent connection parts forms the fin root of the fin part; and
a spacing region between the first connection section and the third connection section forms an air duct.

6. The heat sink according to claim 2, wherein the cooling flow channel comprises an evaporation region and a condensation region, the evaporation region is located at the connection part and the fin root of the fin part, the condensation region is located at the fin top of the fin part, and the refrigerating medium is configured to be vaporized in the evaporation region and liquefied in the condensation region to flow back to the first evaporation region.

7. The heat sink according to claim 1, wherein the heat sink further comprises a support structure, the cavity comprises a top wall and a bottom wall that are oppositely disposed along a height direction of the substrate, and the top wall is closer to the heat dissipation structure than the bottom wall; and
the support structure is supported between the top wall and the bottom wall; or
one end of two ends of the support structure is pressed against one of the top wall and the bottom wall, and the other end is isolated from the other of the top wall and the bottom wall.

8. The heat sink according to claim 7, wherein a groove is disposed on a bottom wall of the heat sink and/or an outer surface of the support structure.

9. The heat sink according to claim 7, wherein the heat sink further comprises a capillary structure located in the cavity and connected to the bottom wall.

10. The heat sink according to claim 1, further comprising: a plurality of heat dissipation structures, and two adjacent heat dissipation structures are spaced from each other at an included angle.

11. The heat sink according to claim 1, wherein the heat sink further comprises a reinforcement structure, and a through-flow channel connected to the cooling flow channel is disposed in the reinforcement structure; and the reinforcement structure is disposed between the connection part and the substrate; or the reinforcement structure is disposed between the connection part and the fin part; or the reinforcement structure is disposed between the fin part and the substrate.

12. A communication device comprising: a heat generation element and a heat sink,
wherein the heat sink comprises:
a substrate;
a heat dissipation structure, wherein the heat dissipation structure comprises a connection part and a fin part that are of an integrated structure, the connection part is connected to the substrate, the fin part and the connection part are disposed at an included angle, a fin root of the fin part is connected to the connection part, a fin top of the fin part is away from the connection part, a cooling flow channel is disposed in the heat dissipation structure, and at least a part of the cooling flow channel is located in the fin part; and
a refrigerating medium configured to flow in the cooling flow channel to dissipate heat from the substrate; and
wherein the heat generation element is disposed on a side that is of the substrate and that is away from the heat dissipation structure, wherein:
a cavity is disposed in the substrate, and the cavity is in communication with the cooling flow channel, so that the refrigerating medium is configured to flow in the cavity and the cooling flow channel;
the connection part comprises a contact surface, the substrate comprises a first surface, and the contact surface is disposed opposite to the first surface;
the cooling flow channel has a first through-flow structure, the first through-flow structure is disposed on the contact surface, the cavity has a second through-flow structure, and the second through-flow structure is disposed on the first surface; and
the second through-flow structure is in communication with at least a part of the first through-flow structure; and
wherein:
the first through-flow structure rises one or more first through-low substructures spaced from each other, the second through-flow structure comprises second through-flow substructures whose quantity is the same as that of the first through-flow substructures, and the first through-flow substructures and the second through-flow substructures are in communication in a one-to-one manner: or
the first through-flow structure comprises a plurality of first through-flow substructures spaced from each other, the second thro flow stricture comprises one second through-flow substructure, and each of the first through-flow substructures is in communication with the second through-flow substructure, or
the first through-flow structure comprises one first through-flow substructure, the second through-flow structure comprises plurality of second through-flow substructures spaced from each other, and each of the second through-flow substructures is in communication with the first through-flow substructure.

13. The communication device according to claim 12, wherein:
the cooling flow channel extends from the connection part to the fin part and extends between the fin root and the fin top; or the cooling flow channel is located in the fin part but not the connection part, and extends between the fin root and the fin top.

14. The communication device according to claim 12, wherein the substrate and the heat dissipation structure are of an integrated structure.

15. The communication device according to claim 12, wherein the heat dissipation structure comprises a plurality of connection parts and a plurality of fin parts, fin roots of two adjacent fin parts are connected through one connection part, and a spacing region between the two adjacent fin parts forms an air duct.

16. The communication device according to claim 12, wherein the fin part comprises a first connection section, a second connection section, and a third connection section;
the first connection section and the third connection section are spaced from each other and are respectively connected to two adjacent connection parts, both the first connection section and the third connection section are disposed at an included angle with the two adjacent connection parts, and the second connection section is connected between an end that is of the first connection section and away from the connection part and an end that is of the third connection section and away from the connection part;
a joint of the first connection section, the second connection section, and the third connection section forms the fin top of the fin part, and a joint of the first connection section, the third connection section, and the two adjacent connection parts forms the fin root of the fin part; and
a spacing region between the first connection section and the third connection section forms an air duct.

17. The heat sink according to claim 1, wherein the first through-flow structure comprises the one or more first through-flow substructures spaced from each other, the second through-flow structure comprises the second through-flow substructures whose quantity is the same as that of the first through-flow substructures, and the first through-flow substructures and the second through-flow substructures are in communication in a one-to-one manner.

18. The heat sink according to claim 1, wherein the first through-flow structure comprises the plurality of first through-flow substructures spaced from each other, the second through-flow structure comprises the one second through-flow substructure, and each of the first through-flow substructures is in communication with the second through-flow substructure.

19. The heat sink according to claim 1, wherein the first through-flow structure comprises the one first through-flow substructure, the second through-flow structure comprises the plurality of second through-flow substructures spaced from each other, and each of the second through-flow substructures is in communication with the first through-flow substructure.

20. The heat sink according to claim 1, wherein the substrate further comprises a second surface and four side walls connected between the first surface and the second surface, the first surface and the second surface are disposed opposite to each other, and the four side walls are sequentially connected to form a peripheral side surface of the substrate.

* * * * *